United States Patent
Ekman et al.

(10) Patent No.: US 9,590,150 B2
(45) Date of Patent: Mar. 7, 2017

(54) LIGHT-EMITTING DEVICE

(71) Applicant: EL-SEED CORPORATION, Nagoya-shi (JP)

(72) Inventors: Johan Ekman, Nagoya (JP); Atsushi Suzuki, Nagoya (JP); Fumiharu Teramae, Nagoya (JP); Tomohiko Maeda, Nagoya (JP); Koichi Naniwae, Nagoya (JP)

(73) Assignee: EL-SEED CORPORATION, Nagoya-Shi, Aichi (JP)

( * ) Notice: Subject to any disclaimer, the term of this patent is extended or adjusted under 35 U.S.C. 154(b) by 0 days.

(21) Appl. No.: 14/900,056

(22) PCT Filed: Jun. 19, 2014

(86) PCT No.: PCT/JP2014/066307
§ 371 (c)(1),
(2) Date: Dec. 18, 2015

(87) PCT Pub. No.: WO2014/203974
PCT Pub. Date: Dec. 24, 2014

(65) Prior Publication Data
US 2016/0141464 A1    May 19, 2016

(30) Foreign Application Priority Data

Jun. 20, 2013  (JP) .................................. 2013-130062
Jun. 20, 2013  (JP) .................................. 2013-130063

(51) Int. Cl.
*H01L 33/00*   (2010.01)
*H01L 33/50*   (2010.01)
(Continued)

(52) U.S. Cl.
CPC ............ *H01L 33/504* (2013.01); *C09K 11/65* (2013.01); *H01L 27/156* (2013.01); *H01L 33/06* (2013.01);
(Continued)

(58) Field of Classification Search
CPC ..... H01L 33/502; H01L 33/504; H01L 33/32; H01L 33/06; H01L 27/156;
(Continued)

(56) References Cited

U.S. PATENT DOCUMENTS 3,527,626 A  *  9/1970  Brander ................. C09K 11/65
                                                         148/33.4
2007/0176531 A1*  8/2007  Kinoshita ........... C09K 11/0883
                                                          313/486
(Continued)

FOREIGN PATENT DOCUMENTS

| GB | 2 428 681 B | 10/2008 |
|---|---|---|
| JP | 4153455 B2 | 9/2008 |
| JP | 2010-027645 A | 2/2010 |
| WO | WO 2007/058153 A1 | 5/2007 |

OTHER PUBLICATIONS

Kinoshita et al., US 2007/0176531, in view of Sun et al., "Room temperature luminescence properties of fluorescent SiC at white light emitting diode medium", 2012, Thin Solid Films, vol. 522 pp. 33-35, published Feb. 11, 2012.*

(Continued)

*Primary Examiner* — Nikolay Yushin
(74) *Attorney, Agent, or Firm* — McGinn IP Law Group, PLLC

(57) ABSTRACT

In order to provide a light-emitting device having improved color rendering properties, a light-emitting device which uses a SiC fluorescent material comprises a first SiC fluorescent portion in which a donor impurity and an acceptor impurity are added and which is formed of a SiC crystal; a (Continued)

second SiC fluorescent portion which is formed of a SiC crystal in which the same donor impurity as the first SiC fluorescent portion and the same acceptor impurity as the first SiC fluorescent portion are added, and in which a concentration of the acceptor impurity is higher than the concentration of the acceptor impurity in the first SiC fluorescent portion and an emission wavelength is longer than that of the first SiC fluorescent portion; and a light-emitting portion that emits excitation light that excites the first SiC fluorescent portion and the second SiC fluorescent portion. The color rendering property of the SiC fluorescent material is improved and it becomes easy to adjust the color temperature and the color rendering index of the light-emitting device which uses the SiC fluorescent material.

2 Claims, 24 Drawing Sheets

(51) Int. Cl.

| | | |
|---|---|---|
| *C09K 11/65* | (2006.01) | |
| *H01L 27/15* | (2006.01) | |
| *H01L 33/06* | (2010.01) | |
| *H01L 33/32* | (2010.01) | |
| *F21Y 101/00* | (2016.01) | |

(52) U.S. Cl.
CPC ............ *H01L 33/32* (2013.01); *H01L 33/502* (2013.01); *F21K 9/232* (2016.08); *F21Y 2101/00* (2013.01); *F21Y 2105/10* (2016.08); *F21Y 2115/10* (2016.08); *H01L 2224/48091* (2013.01); *H01L 2224/48247* (2013.01); *H01L 2224/48257* (2013.01); *H01L 2924/181* (2013.01)

(58) Field of Classification Search
CPC . H01L 27/1218; H01L 27/1225; C09K 11/65; C09K 11/59; C09K 11/063; F21K 9/135; F21K 9/30; F21K 9/56; F21Y 2105/001; F21Y 2101/02

See application file for complete search history.

(56) References Cited

U.S. PATENT DOCUMENTS

2008/0277670 A1    11/2008   Kamiyama et al.
2010/0007267 A1     1/2010   Imai et al.

OTHER PUBLICATIONS

Ou et al., "Donor-acceptor-pair emission characterization in N-B doped fluorescent SiC", 2011, Optical Materials Express. vol. 1, No. 8 pp. 1439-1446, published Nov. 2, 2011.*
Kamiyama et al., "Extremely high quantum efficiency of donor-acceptor-pair emission in N- and B-doped 6H-SiC", 2006, Journal of Applied Physics, vol. 99, pp. 093108-1-4 , published May 15, 2006.*
Syväjärvi et al., "Fluorescent SiC as a new material for white LEDs", 2012, Physica Scripta, vol. T148, 014002-p, published Mar. 15, 2012.*
Sun et al., "Fluorescent silicon carbide as an ultraviolet-to-visible lighy convertor by control of donor to acceptor recombinations", 2012, J. Phys. D: Applied Physics, vol. 45, 235107, published May 25, 2012.*
Ou et al, "Advances in wide bandgap SiC for optoelectronics", 2014, Eur. Physics J. B, vol. 87 58, published Mar. 10, 2014.*
International Search Report (ISR) (PCT Form PCT/ISA/210), in PCT/JP2014/066307, dated Sep. 16, 2014.
Satoshi Kamiya et al., "White light-emitting diode based on flouresent SiC," Thin Solid Films, 2012, vol. 522, p. 23-25.
Toshitake Nakata et al., "Fabrication techniques and electro-optical properties of 4HSiC blueish-purple LEDs", Journal of the Vacuum Society of Japan, 1989, vol. 32, No. 11, pp. 797 to 800 (with English Abstract and English translation).
J. W. Sun, et al.: "Fluorescent Silicon Carbide as an Ultraviolet-to-Visible Light Converter by Control of Donor to Acceptorrecombinations", J. Phys. D: Appl. Phys., vol. 45, 235107, May 25, 2012, pp. 1-6, XP002763542.
M. Syvajarvi, et al: "Fluorescent SiC as a New Material for White LEDs", Physica Scripta, vol. T148, 14002, Mar. 15, 2012, pp. 1-5, XP055039547, ISSN: 0031-8949, D01: 10.1088/0031-8949/2012/T148/014002.
M. Ikeda, et al.: "Site Effect on the Impurity Levels in 4H, 6H, and 15R SiC" Physical Review B, val. 22, No. 6, Sep. 15, 1980, pp. 2842-2854, XP002763597.

\* cited by examiner

F I G. 1
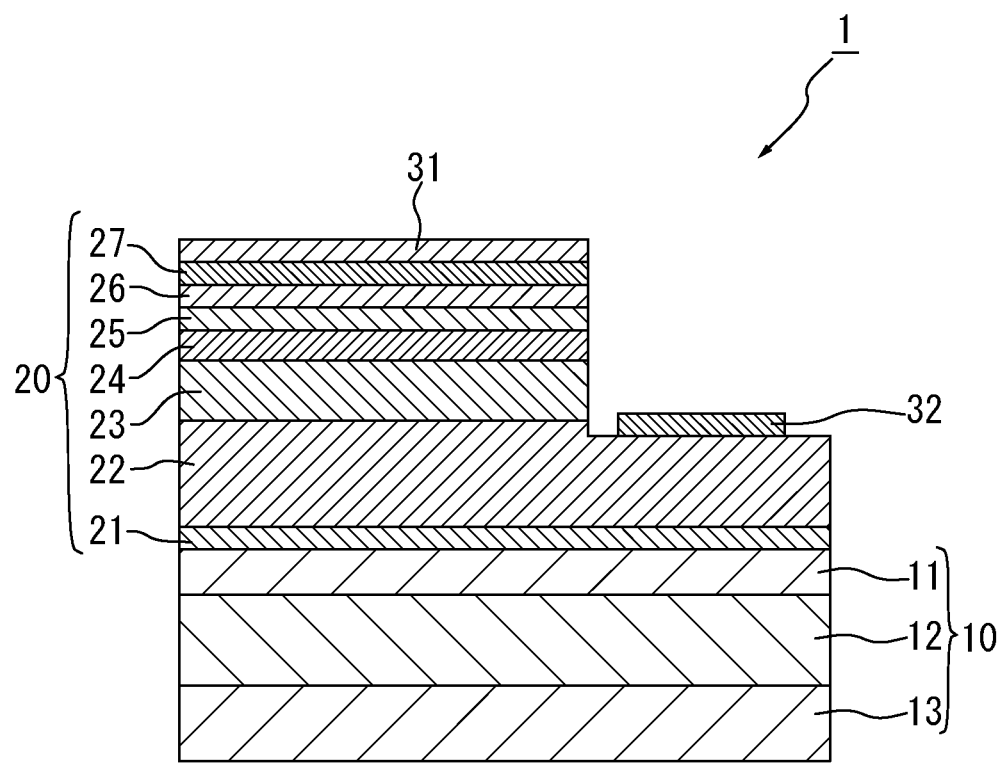

F I G. 4
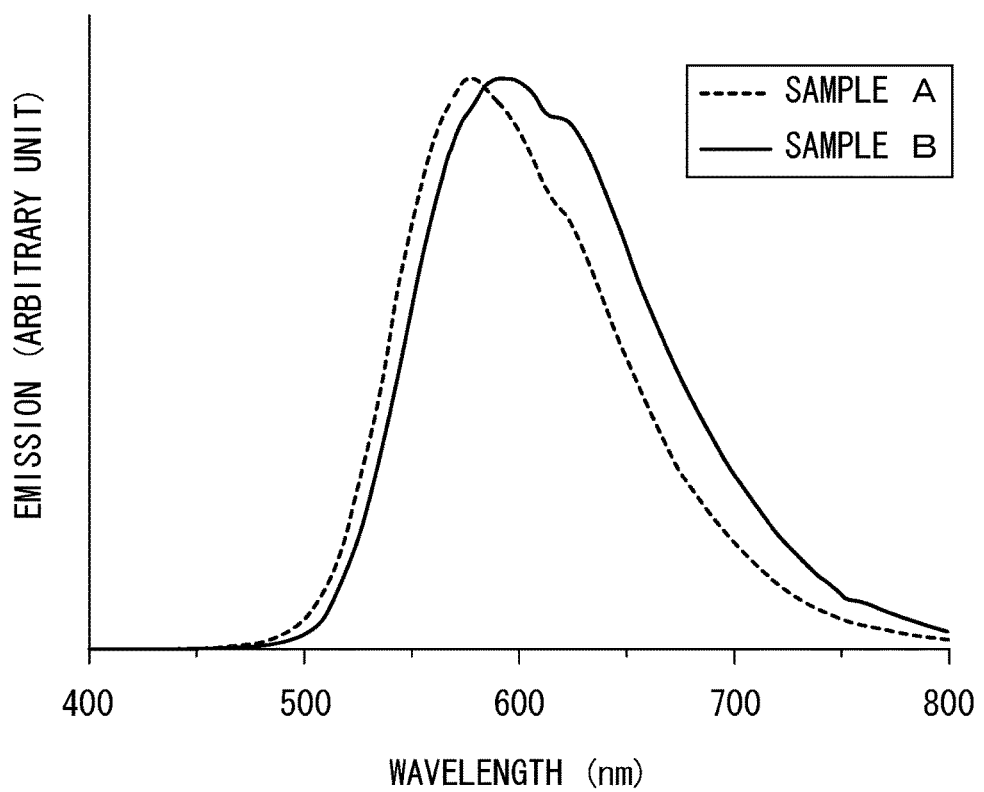

FIG. 5

| SAMPLE A | SAMPLE B | IMPROVEMENT IN CRI (%) |
|---|---|---|
| 100 | 0 | —— |
| 90 | 10 | 6.24 |
| 80 | 20 | 6.59 |
| 70 | 30 | 6.76 |
| 60 | 40 | 7.11 |
| 50 | 50 | 7.11 |
| 40 | 60 | 7.11 |
| 30 | 70 | 6.93 |
| 20 | 80 | 6.59 |
| 10 | 90 | 6.24 |

F I G. 9

| | IQE (Relative Emission Intensity) | Carrier Concentration at Room Temperature [cm$^{-3}$] | $N_D - N_A$ [cm$^{-3}$] | Hall/($N_D - N_A$) [%] | $N_{SD} : N_{DD}$ |
|---|---|---|---|---|---|
| Sample C | 4 | $2.61 \times 10^{17}$ | $1.60 \times 10^{18}$ | 16.3 | 1 : 23 |
| Sample D | 1 | $3.17 \times 10^{18}$ | $9.28 \times 10^{18}$ | 33.7 | 1 : 2 |

F I G. 1 1
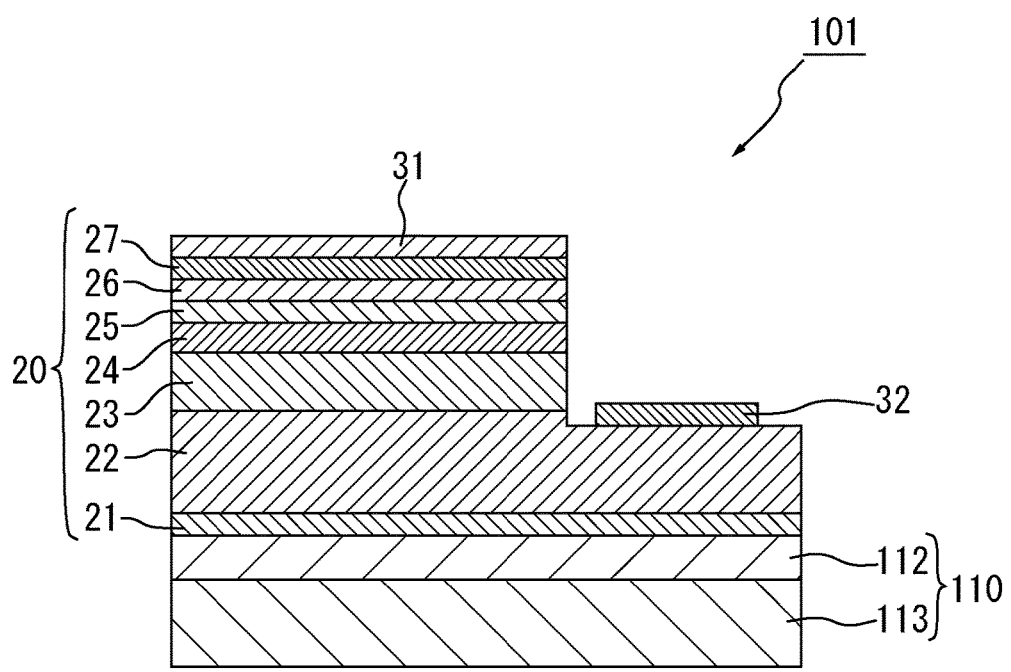

F I G. 1 4
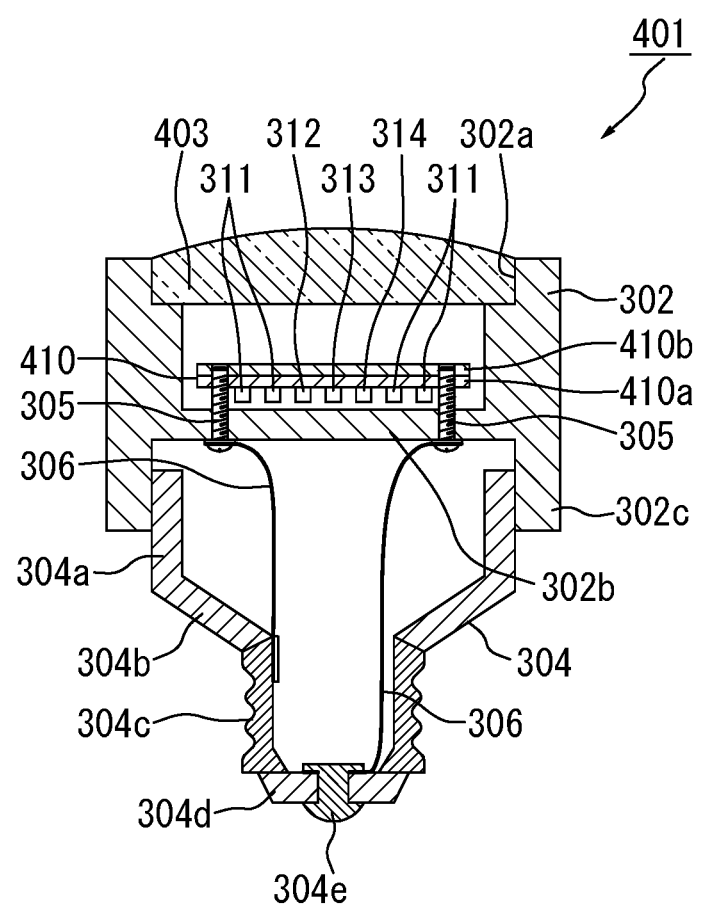

F I G. 15
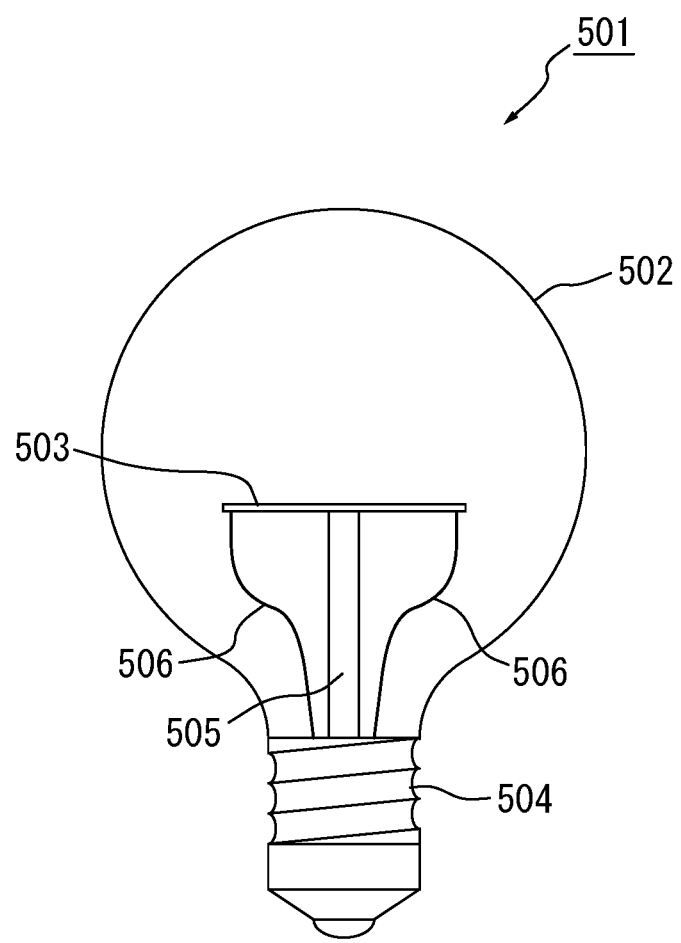

F I G. 1 6
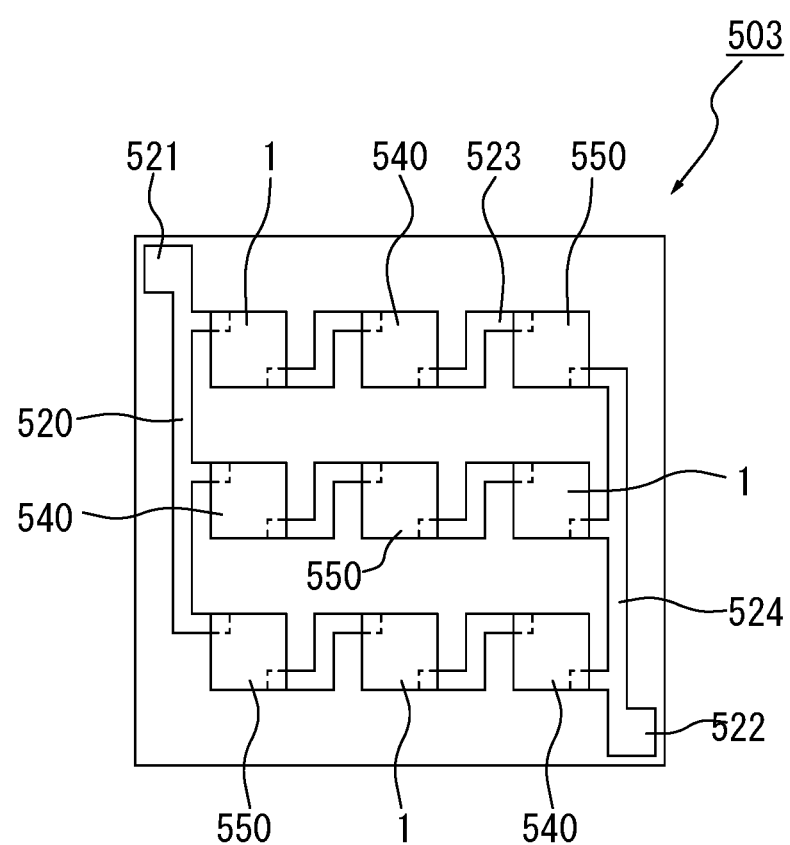

F I G. 2 0
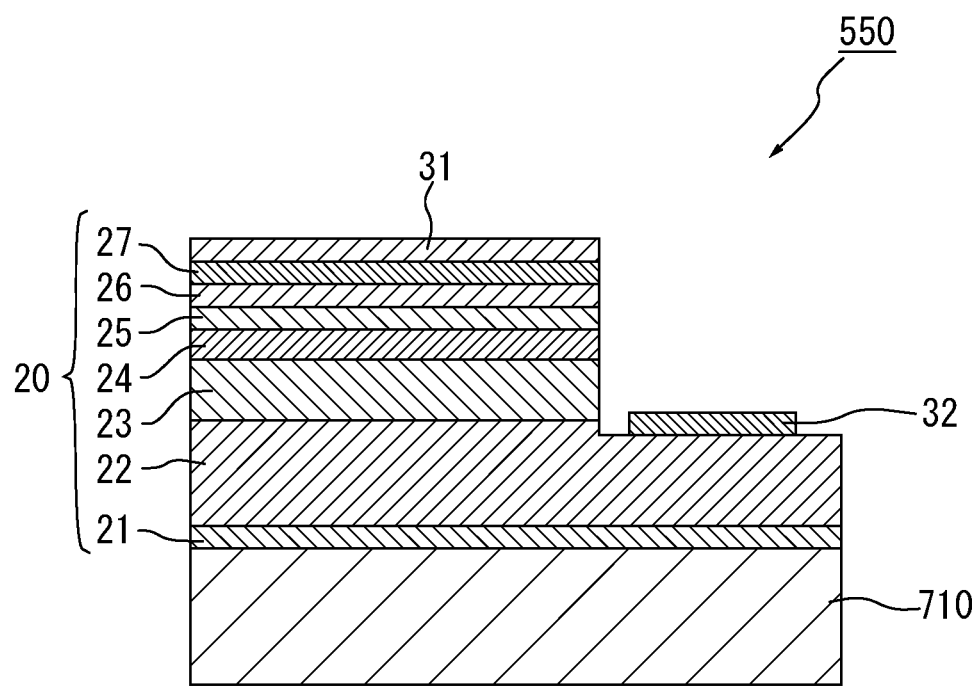

LIGHT-EMITTING DEVICE

TECHNICAL FIELD

The present invention relates to an LED element which uses a SiC fluorescent material.

BACKGROUND ART

A light-emitting diode (LED) has widely been put into practice as a light-emitting element due to p-n junction of a compound semiconductor, and has mainly been used in optical transmission, display and lighting applications. Since white LED has insufficient energy conversion efficiency as compared to an existing fluorescent lamp, there is a need to perform significant improvement in efficiency to general lighting applications. There remain many issues in realization of LED having high color rendering properties, low cost, and large luminous flux.

Currently marketed white LEDs are commonly equipped with a blue light-emitting diode element mounted on a lead frame, a yellow phosphor layer formed of YAG and Ce covered with this blue light-emitting diode element, and a molded lens formed of a transparent material suelemental substancech as an epoxy resin, which covers them. In the white LEDs, when blue light is emitted from the blue light-emitting diode element, blue light is partially converted into yellow light in the case of passing through the yellow phosphor. Since blue color and yellow color have complementary color relation to each other, blue light and yellow light are mixed to obtain white light. In the white LEDs, there is a need to perform an improvement in performances of the blue light-emitting diode element so as to improve efficiency and to improve color rendering properties.

There has been known, as the blue light-emitting diode element, a blue light-emitting diode element comprising, on an n-type SiC substrate, a buffer layer formed of AlGaN, an n-type GaN layer formed of n-GaN, a multiple-quantum-well active layer formed of GaInN/GaN, an electron blocking layer formed of p-AlGaN, and a p-type contact layer formed of p-GaN stacked successively from the SiC substrate side in this order. In this blue light-emitting diode element, a p-side electrode is formed on a front surface of the p-type contact layer and also an n-side electrode is formed on a back surface of the SiC substrate, and an electric current is allowed to flow by applying a voltage between the p-side electrode and the n-side electrode, whereby, blue light is emitted from the multiple-quantum-well active layer. Here, since the SiC substrate has conductivity, unlike the blue light-emitting diode element using a sapphire substrate, it is possible to dispose electrodes one above the other, and to attempt to make simplifications to the manufacturing process, in-plane uniformity of an electric current, effective utilization of a light-emitting area to a chip area, and the like.

There has also been proposed a light-emitting diode element which produces white light alone without utilizing a phosphor (see, for example, Patent Literature 1). In this light-emitting diode element, a fluorescent SiC substrate including a first SiC layer doped with B and N and a second SiC layer doped with Al and N is used in place of the n-type SiC substrate of the above-mentioned blue light-emitting diode element, thus emitting near-ultraviolet rays from the multiple-quantum-well active layer. Near ultraviolet rays are absorbed by the first SiC layer and the second SiC layer, and thus near-ultraviolet rays are converted into visible rays ranging in color from green to red in the first SiC layer and near-ultraviolet rays are converted into visible rays ranging in color from blue to red in the second SiC layer, respectively. As a result, white light having high color rendering properties near the sunlight is emitted from the fluorescent SiC substrate.

CITATION LIST

Patent Literature

Patent Literature 1: Japanese Patent Publication No. 4153455

SUMMARY OF INVENTION

Technical Problem

The inventors of the present application have further studied intensively about an improvement in a color rendering property of a light-emitting device which uses a SiC fluorescent material. If the color rendering property of a SiC fluorescent material can be improved, it becomes easy to adjust the color temperature and the color rendering index of a light-emitting device which uses the SiC fluorescent material.

The present invention has been made in view of the above circumstances and an object thereof is to provide a light-emitting device which uses a SiC fluorescent material having improved color rendering properties.

Solution to Problem

In order to achieve the above-described object, the present invention provides a light-emitting device including: a first SiC fluorescent portion in which a donor impurity and an acceptor impurity are added and which is formed of a SiC crystal; a second SiC fluorescent portion which is formed of a SiC crystal in which the same donor impurity as the first SiC fluorescent portion and the same acceptor impurity as the first SiC fluorescent portion are added, and in which a concentration of the acceptor impurity is higher than the concentration of the acceptor impurity in the first SiC fluorescent portion and an emission wavelength is longer than that of the first SiC fluorescent portion; and a light-emitting portion that emits excitation light that excites the first SiC fluorescent portion and the second SiC fluorescent portion.

In the light-emitting device, the donor impurity may be nitrogen, the acceptor impurity may be boron, the concentration of the acceptor impurity in the first SiC fluorescent portion may be lower than $5 \times 10^{18}/cm^3$, and the concentration of the acceptor impurity in the second SiC fluorescent portion may be higher than $5 \times 10^{18}/cm^3$.

In the light-emitting device, the first SiC fluorescent portion and the second SiC fluorescent portion may be continuously formed by changing the concentration of the acceptor impurity.

In the light-emitting device, the first SiC fluorescent portion and the second SiC fluorescent portion may be formed so that the concentration of the acceptor impurity therein is substantially uniform.

In the light-emitting device, the light-emitting device may be a LED element including a SiC substrate which includes a first SiC layer that forms the first SiC fluorescent portion and a second SiC layer that forms the second SiC fluorescent portion and a GaN-based semiconductor layer that is formed on the SiC substrate to form the light-emitting portion.

In the light-emitting device, the SiC substrate may include a third SiC layer in which the donor impurity is nitrogen and the acceptor impurity is aluminum, and the first SiC layer, the second SiC layer, and the third SiC layer may be arranged from the GaN-based semiconductor layer in ascending order of nitrogen concentrations.

In the light-emitting device, the first SiC fluorescent portion and the second SiC fluorescent portion are formed of a SiC crystal in which carbon atoms are disposed in a cubic site and a hexagonal site and are configured such that a ratio of a donor impurity substituting a carbon atom at a cubic site to a donor impurity substituting a carbon atom at a hexagonal site may be larger than a ratio of the cubic site to the hexagonal site in a crystal structure.

The present invention further provides a light-emitting device that emits white light, wherein the LED element according to claim 5 is included as a SiC fluorescent LED element, the SiC substrate of the SiC fluorescent LED element forms a 6H-type SiC red fluorescent portion that emits red light when excited by ultraviolet light, and the GaN-based semiconductor layer of the SiC fluorescent LED element emits ultraviolet light.

The light-emitting device may further include at least one LED element other than the SiC fluorescent LED element.

In the light-emitting device, the SiC fluorescent LED element may include a 6H-type SiC orange fluorescent portion in which a boron concentration is lower than a boron concentration in the 6H-type SiC red fluorescent portion and which emits orange light when excited by the ultraviolet light.

In the light-emitting device, the SiC fluorescent LED element may include a 6H-type SiC blue fluorescent portion which is doped with nitrogen as a donor impurity and aluminum as an acceptor impurity and which emits blue light when excited by ultraviolet light.

In the light-emitting device, at least one of LED elements other than the SiC fluorescent LED element may include a nitride semiconductor layer that emits ultraviolet light and a SiC substrate including a 4H-type SiC green fluorescent portion which is doped with nitrogen as a donor impurity and a boron as an acceptor impurity and which emits green light when excited by the ultraviolet light.

The present invention further provides a light-emitting device that emits white light, including: a 6H-type SiC red fluorescent portion which is doped with nitrogen as a donor impurity and boron as an acceptor impurity, in which a boron concentration is higher than $5 \times 10^{18}/cm^3$, and which emits red light when excited by ultraviolet light.

The light-emitting device may further include a SiC fluorescent LED element including a SiC substrate which includes the 6H-type SiC red fluorescent portion and a nitride semiconductor layer that emits ultraviolet light; and at least one LED element other than the SiC fluorescent LED element.

In the light-emitting device, the 6H-type SiC red fluorescent portion may be configured such that a ratio of a donor impurity substituting a carbon atom at a cubic site to a donor impurity substituting a carbon atom at a hexagonal site is larger than a ratio of the cubic site to the hexagonal site in a crystal structure.

In the light-emitting device, the SiC fluorescent LED element may include a 6H-type SiC orange fluorescent portion in which a boron concentration is lower than a boron concentration in the 6H-type SiC red fluorescent portion and which emits orange light when excited by the ultraviolet light.

In the light-emitting device, the SiC fluorescent LED element may include a 6H-type SiC blue fluorescent portion in which nitrogen as a donor impurity and aluminum as an acceptor impurity are doped and which emits blue light when excited by the ultraviolet light.

In the light-emitting device, the 6H-type SiC red fluorescent portion, the 6H-type SiC orange fluorescent portion, and the 6H-type SiC blue fluorescent portion may be arranged from the nitride semiconductor layer in ascending order of nitrogen concentrations.

In the light-emitting device, at least one of LED elements other than the SiC fluorescent LED element may be a second SiC fluorescent LED element including a nitride semiconductor layer that emits ultraviolet light and a SiC substrate that includes a 4H-type SiC green fluorescent portion which is doped with nitrogen as a donor impurity and boron as an acceptor impurity and which emits green light when excited by the ultraviolet light.

Advantageous Effects of Invention

According to the present invention, it is possible to improve the color rendering property of a light-emitting device which uses a SiC fluorescent material.

BRIEF DESCRIPTION OF DRAWINGS

FIG. 1 is a schematic cross-sectional view of a light-emitting diode element, which illustrates a first embodiment of the present invention;

FIG. 4 is a graph illustrating the relation between the wavelength and the emission intensity when a boron concentration is changed;

FIG. 5 is a table illustrating an improvement in a color rendering index when Samples A and B are mixed, as compared to the color rendering index (CRI) of Sample B;

FIG. 9 is a table illustrating a relative emission intensity, a carrier concentration at room temperature, a difference between a donor impurity and an acceptor impurity, a ratio of Hall to the difference, and a ratio of donors forming a shallow donor level to donors forming a deep donor level of Samples C and D;

FIG. 11 is a schematic cross-sectional view of a light-emitting diode element illustrating a modified example;

FIG. 14 is an schematic cross-sectional view of a light-emitting device illustrating a fourth embodiment of the present invention;

FIG. 15 is an overall side view of a light-emitting device illustrating a fifth embodiment of the present invention;

FIG. 16 is a plan view of a package substrate;

FIG. 20 is a schematic cross-sectional view of a blue LED element;

DESCRIPTION OF EMBODIMENTS

FIGS. 1 to 10 illustrate a first embodiment of the present invention, and FIG. 1 is a schematic cross-sectional view of a light-emitting diode element.

As illustrated in FIG. 1, a LED element 1 as a light-emitting device emits white light and includes a SiC substrate 10 that contains a donor impurity and an acceptor impurity and a GaN-based semiconductor layer 20 formed on the SiC substrate 10. When light is incident on the SiC substrate 10 from the GaN-based semiconductor layer 20, the incident light is absorbed in the SiC substrate 10 to produce fluorescence corresponding to an impurity level.

Figure 2:
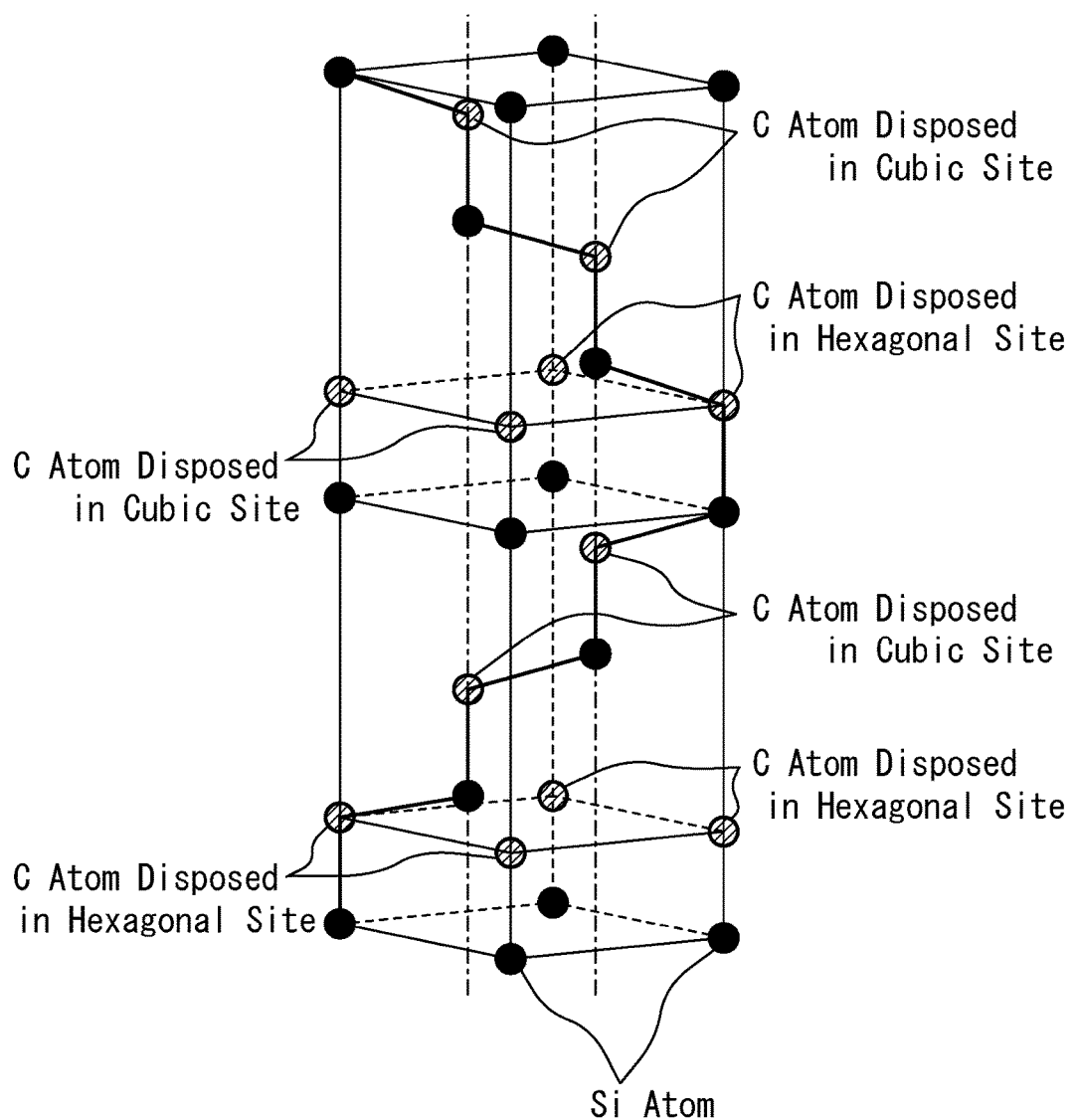
FIG. 2 is a schematic view of a 6H-type SiC crystal.

As illustrated in FIG. 2, the SiC substrate 10 is formed of a 6H-type SiC crystal having a periodic structure every six layers, and contains nitrogen as a donor impurity and also contains boron or aluminum as an acceptor impurity. The SiC substrate 10 includes a first SiC layer 11 doped with nitrogen and aluminum and a second SiC layer 12 and a third SiC layer 13 doped with nitrogen and boron.

In the first SiC layer 11, the second SiC layer 12, and the third SiC layer 13, the concentration of a donor impurity is higher than the concentration of the acceptor impurity, and a difference in concentration is $1\times10^{18}/cm^3$ or lower. The first SiC layer 11, the second SiC layer 12, and the third SiC layer 13 are arranged from the GaN-based semiconductor layer 20 in ascending order of nitrogen concentrations. In the present embodiment, the concentration of boron in the second SiC layer 12 is lower than $5\times10^{18}/cm^3$ and the concentration of boron in the third SiC layer 13 is higher than $5\times10^{18}/cm^3$.

A method for manufacturing a SiC substrate 10 is optional and, for example, the SiC substrate can be manufactured by growing a SiC crystal using a sublimation method or a chemical vapor deposition method. In this case, it is possible to optionally set the concentration of nitrogen in the SiC substrate 10 by appropriately adjusting a partial pressure of a nitrogen gas ($N_2$) in an atmosphere during the crystal growth. Meanwhile, it is possible to optionally set the concentration of boron in the SiC substrate 10 by mixing a moderate amount of a boron elemental substance or a boron compound with a raw material. Moreover, it is possible to optionally set the concentration of aluminum in the SiC substrate 10 by mixing a moderate amount of an aluminum elemental substance or an aluminum compound with a raw material. The lower concentration of the donor impurity and the acceptor impurity enables the impurity concentration to be controlled with higher accuracy.

Here, boron which is an acceptor substitutes a carbon atom or a silicon atom. A boron atom is smaller than a silicon atom and the formation energy required for substituting a silicon atom is large. Thus, in general, a boron atom rarely substitutes a silicon atom to be disposed in a silicon site. However, the boron atom can substitute a silicon atom adjacent to carbon vacancy. It is considered that the proportion of boron which substitutes a carbon atom and is disposed in a carbon site and the proportion of boron which substitutes a silicon atom adjacent to the carbon vacancy and is disposed in a silicon site in the second SiC layer 12 are different from those in the third SiC layer 13.

Here, the cubic site accounts for two-thirds of the 6H-type SiC crystal, while the hexagonal site accounts for one-thirds thereof. Commonly, nitrogen as the donor impurity is disposed in each site in the same proportion as the presence proportion. In other words, in the case of 6H-type SiC, two-thirds of the nitrogen substitutes the carbon atom at the cubic site and one-thirds of the nitrogen substitutes the carbon atom at the hexagonal site. However, since the SiC crystal of the present embodiment is manufactured through the step of operating a donor so as to increase the concentration of a donor impurity in the cubic site, a ratio of a donor impurity substituting a carbon atom at a cubic site to a donor impurity substituting a carbon atom at a hexagonal site is larger than a ratio of the cubic site to the hexagonal site in a crystal structure.

As illustrated in FIG. 1, the GaN-based semiconductor layer 20 includes a buffer layer 21 comprised of AlGaN, a first contact layer 22 comprised of n-GaN, a first clad layer 23 comprised of n-AlGaN, a multiple-quantum-well active layer 24 comprised of GaInN/GaN, an electron blocking layer 25 comprised of p-AlGaN, a second clad layer 26 comprised of p-AlGaN, and a second contact layer 27 comprised of p-GaN, which are arranged continuously in that order from the SiC substrate 10. The GaN-based semiconductor layer 20 is stacked on the SiC substrate 10 by, for example, metal organic vapor phase epitaxy. A p-electrode 31 formed of Ni/Au is formed on a front surface of the second contact layer 27. The first contact layer 22 is exposed by etching from the second contact layer 27 to a predetermined position of the first contact layer 22 in a thickness direction, and an n-electrode 32 formed of Ti/Al/Ti/Au is formed on this exposed portion.

In the present embodiment, a multiple-quantum-well active layer 108 is formed of $Ga_{0.95}In_{0.05}N/GaN$, and an emission peak wavelength is 385 nm. The peak wavelength in the multiple-quantum-well active layer 24 can be optionally changed. As long as at least a first conductivity-type layer, an active layer, and a second conductivity-type layer are included and, when a voltage is applied to the first conductivity-type layer and the second conductivity-type layer, light is emitted by the recombination of electrons and holes in the active layer, layer configuration of the GaN-based semiconductor layer 20 is optional.

When a forward voltage is applied to a p-electrode 31 and an n-electrode 32 of the white light-emitting diode 1 having such a configuration, an electric current is injected into the GaN-based semiconductor layer 20 and light having a peak wavelength in a near-ultraviolet region is emitted from the multiple-quantum-well active layer 24. The emitted near-ultraviolet rays are incident on the SiC substrate 10 doped with an acceptor impurity and a donor impurity, and almost all of near-ultraviolet rays are absorbed therein. In the SiC substrate 10, when donor electrons and acceptor holes are recombined using near-ultraviolet rays as excitation light, fluorescence is produced whereby light ranging in color from blue to green is emitted in the first SiC layer 11 and light ranging in color from yellow to red is emitted in the second SiC layer 12 and the third SiC layer 13.

Figure 3:
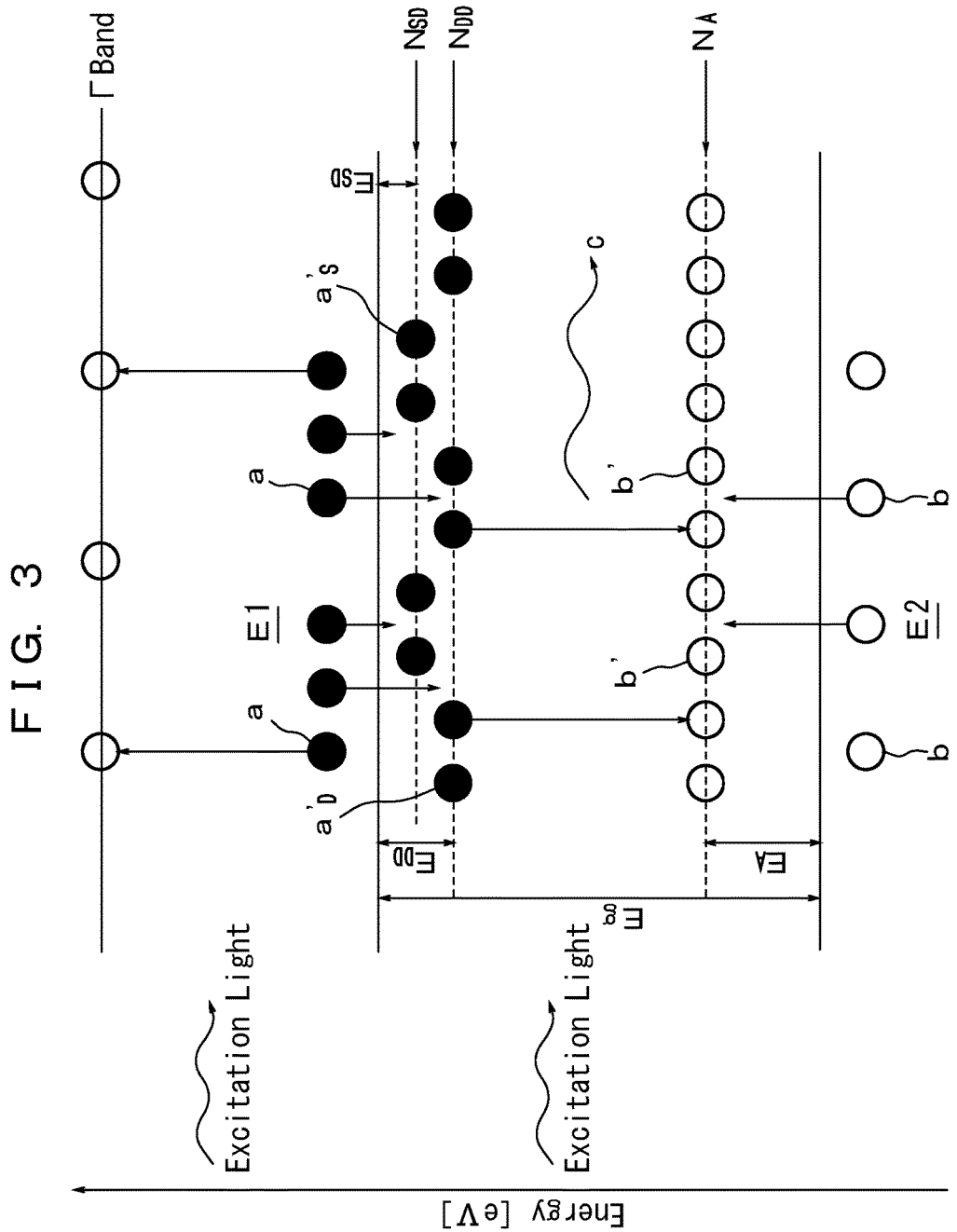
FIG. 3 is an explanatory view schematically illustrating a state where light incident on a SiC substrate is converted into fluorescence.

Here, the fluorescence action in the SiC substrate 10 will be described with reference to FIG. 3. FIG. 3 is an explanatory view schematically illustrating a state where light incident on a SiC substrate is converted into fluorescence.

Since the SiC substrate 10 is mainly formed of a SiC crystal, band gap energy $E_g$ of a 6H-type SiC crystal is formed.

When light is incident on the SiC substrate 10, a free electron "a" is excited from a valence band E2 to a conduction band E1 to produce free hole "b" at E2. In a short time of several ns to several μs, a free electron "a" becomes donor electrons $a_s'$, $a_D'$ by relaxation to donor levels $N_{SD}$, $N_{DD}$, while free hole "b" become acceptor hole b' by relaxation to an acceptor level $N_A$. The acceptor level $N_A$ in a silicon site is different from that in a carbon site.

Here, it has already been found that the donor in the cubic site forms a deep donor level $N_{DD}$, while the donor in the hexagonal site forms a shallow donor level $N_{SD}$.

A donor electron $a_D'$ relaxed to the deep donor level $N_{DD}$ is used for donor-acceptor pair (DAP) emission, and is recombined with acceptor hole b'. Then, a photon c with energy corresponding to the transition energy ($E_g$-$E_{DD}$-$E_A$) is emitted out of the SiC substrate 10. The wavelength of photon c emitted out of the SiC substrate 10 depends on the transition energy ($E_g$-$E_{DD}$-$E_A$).

Meanwhile, a donor electron $a_s$ relaxed to the shallow donor level $N_{SD}$ is used for in-band absorption with a Γ-band, and is not recombined with an acceptor hole b'. In other words, it does not contribute to light emission.

In order to accurately perform donor-acceptor pair emission, the carrier concentration at room temperature in the SiC crystal is preferably smaller than a difference between the donor concentration and the acceptor concentration.

Furthermore, since ionization energy of nitrogen is smaller than that of boron and aluminium, nitrogen is ionized to some extent at room temperature. Therefore, an excited donor electron ad transits again to the conduction band E1, resulting in lacking of donor electron $a_D'$ which forms a pair together with the acceptor hole b'. Acceptor hole b' free from donor electron $a_D'$, which forms a pair together with acceptor hole b', cannot contribute to emission of fluorescence, leading to a waste of consumption of energy for exciting the acceptor hole b'. In other words, it is possible to realize high fluorescence quantum efficiency by setting the concentration of nitrogen at the concentration larger than that of boron through foreseeing of the amount of nitrogen to be ionized so that donor electron $a_D'$ and acceptor hole b' can be recombined in just proportions.

Here, depending on whether boron is disposed in a silicon site adjacent to the carbon vacancy or is disposed in a carbon site, the acceptor level $N_A$ changes and the emission wavelength changes. Here, it is considered that the boron concentration determines the site in which boron is disposed. FIG. 4 is a graph illustrating the relation between the wavelength and the emission intensity when the boron concentration is changed. Here, Sample A was manufactured by setting a boron concentration to $3.5 \times 10^{18}/cm^3$ and a nitrogen concentration to $4.5 \times 10^{18}/cm^3$, and Sample B was manufactured by setting a boron concentration to $9 \times 10^{18}/cm^3$ and a nitrogen concentration to $1 \times 10^{19}/cm^3$.

As illustrated in FIG. 4, the peak wavelength in Sample A was 571 nm and the peak wavelength in Sample B was 605 nm. It is considered that the amount of boron disposed in the silicon site adjacent to the carbon vacancy is relatively large in Sample A whereas the amount of boron disposed in the carbon site is relatively large in Sample B. When the boron concentration is $5 \times 10^{18}/cm^3$, the peak wavelength is 596.5 nm. It is considered that boron is likely to be disposed in the silicon site adjacent to the carbon vacancy when the boron concentration is lower than $5 \times 10^{18}/cm^3$ whereas boron is likely to be disposed in the carbon site when the boron concentration is higher than $5 \times 10^{18}/cm^3$. It can be said that emission light has a relatively short wavelength when the boron concentration is approximately between $5 \times 10^{17}/cm^3$ and $5 \times 10^{18}/cm^3$ whereas emission light has a relatively long wavelength when the boron concentration is approximately $5 \times 10^{18}/cm^3$ and $5 \times 10^{19}/cm^3$.

FIG. 5 is a table illustrating an improvement in a color rendering index when Samples A and B are mixed, as compared to the color rendering index (CRI) of Sample B. Here, a mixture ratio of Samples A and B in FIG. 5 was set based on an emission intensity at a peak emission wavelength of each Sample. The emission intensity of each Sample can be adjusted by changing a plate thickness of a planar sample or changing the amount of a powder-like sample. As illustrated in FIG. 5, it can be understood that CRI is improved when Sample B is mixed using Sample A as a reference.

Figure 6:
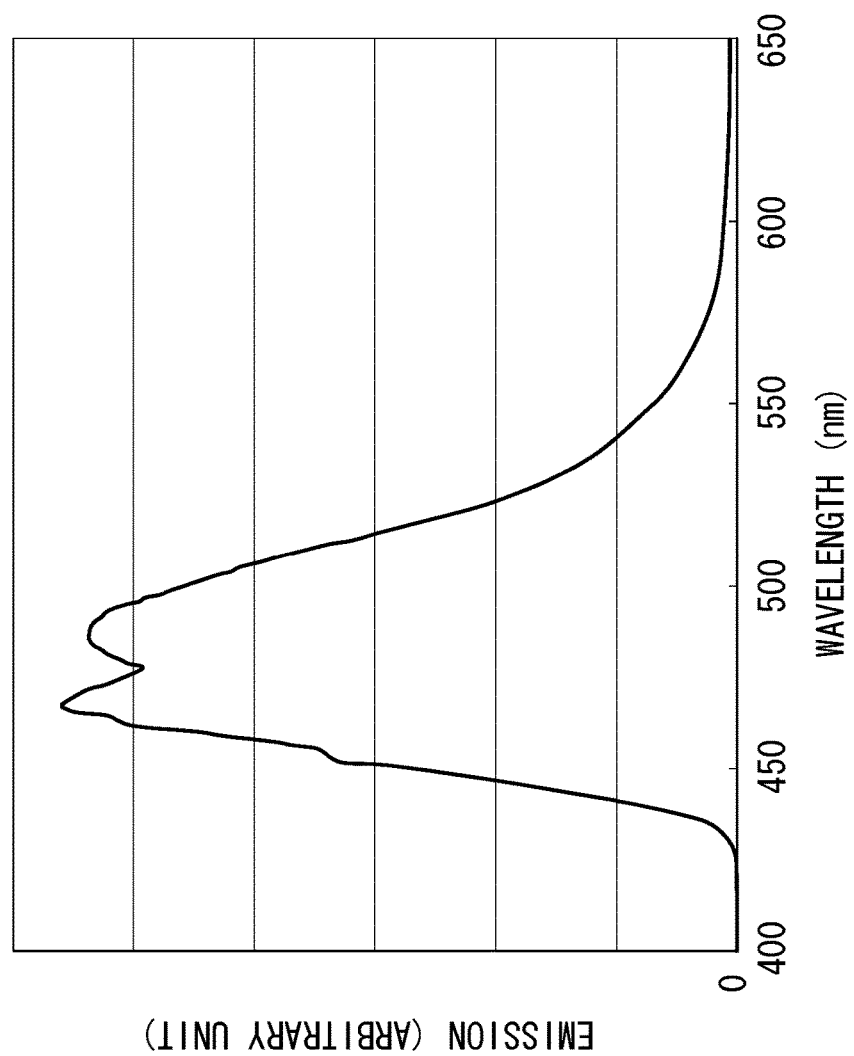
FIG. 6 is a graph illustrating the relation between the wavelength and the emission intensity when aluminum is used as an acceptor impurity.

FIG. 6 is a graph illustrating the relation between the wavelength and the emission intensity when aluminum is used as an acceptor impurity. This sample was manufactured by setting an aluminum concentration to $1 \times 10^{18}/cm^3$ and a nitrogen concentration to $2 \times 10^{18}/cm^3$. As illustrated in FIG. 6, this sample has two peak wavelengths of 467 nm and 486 nm.

Figure 7:
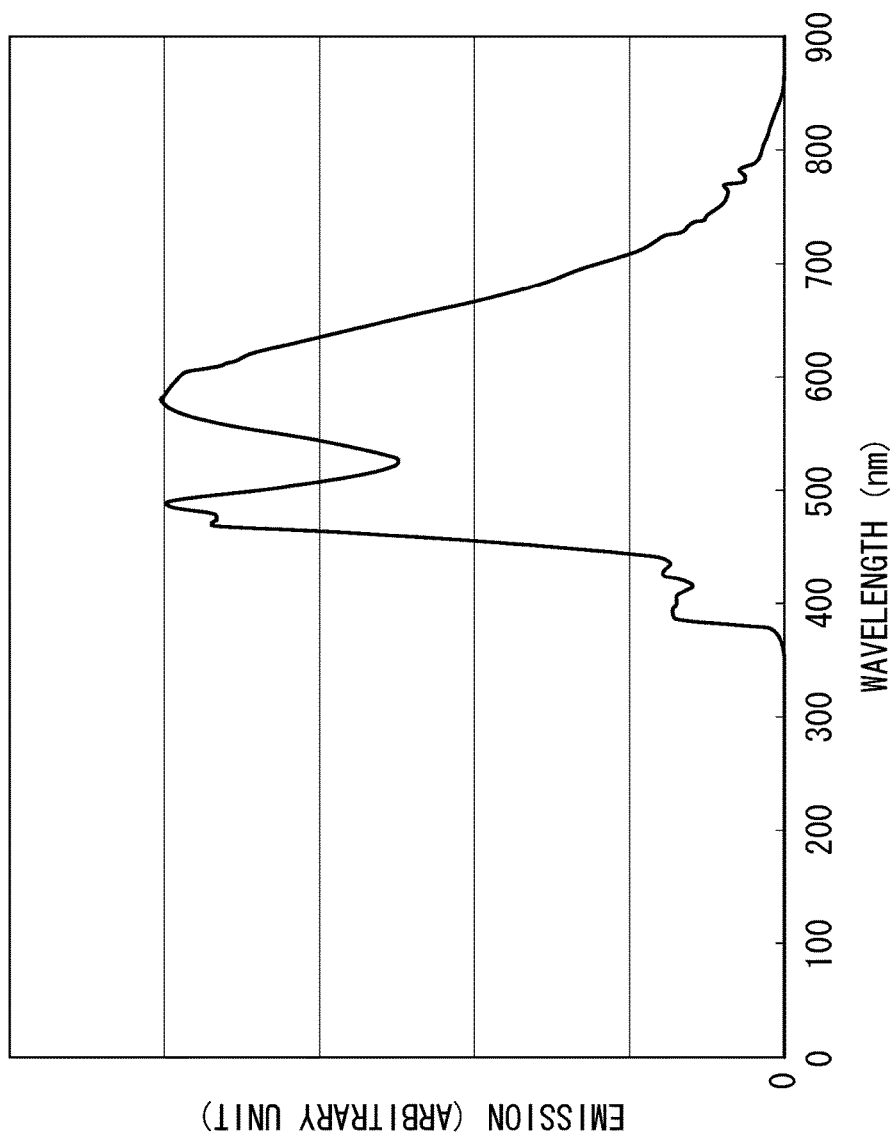
FIG. 7 is a graph illustrating the relation between the wavelength and the emission intensity of a SiC substrate that includes a first SiC layer, a second SiC layer, and a third SiC layer.

FIG. 7 is a graph illustrating the relation between the wavelength and the emission intensity of a SiC substrate that includes a first SiC layer, a second SiC layer, and a third SiC layer. Here, the impurity concentration of the first SiC layer 11 was set similarly to the sample illustrated in FIG. 6, the impurity concentration of the second SiC layer 12 was set similarly to Sample A, and the impurity concentration of the third SiC layer 13 was set similarly to Sample B. As illustrated in FIG. 7, the SiC substrate 10 has an emission spectrum ranging in color from blue to red. In particular, in the range from yellow to red, the emission spectrums of the second SiC layer 12 and the third SiC layer 13 overlap each other.

Figure 8:
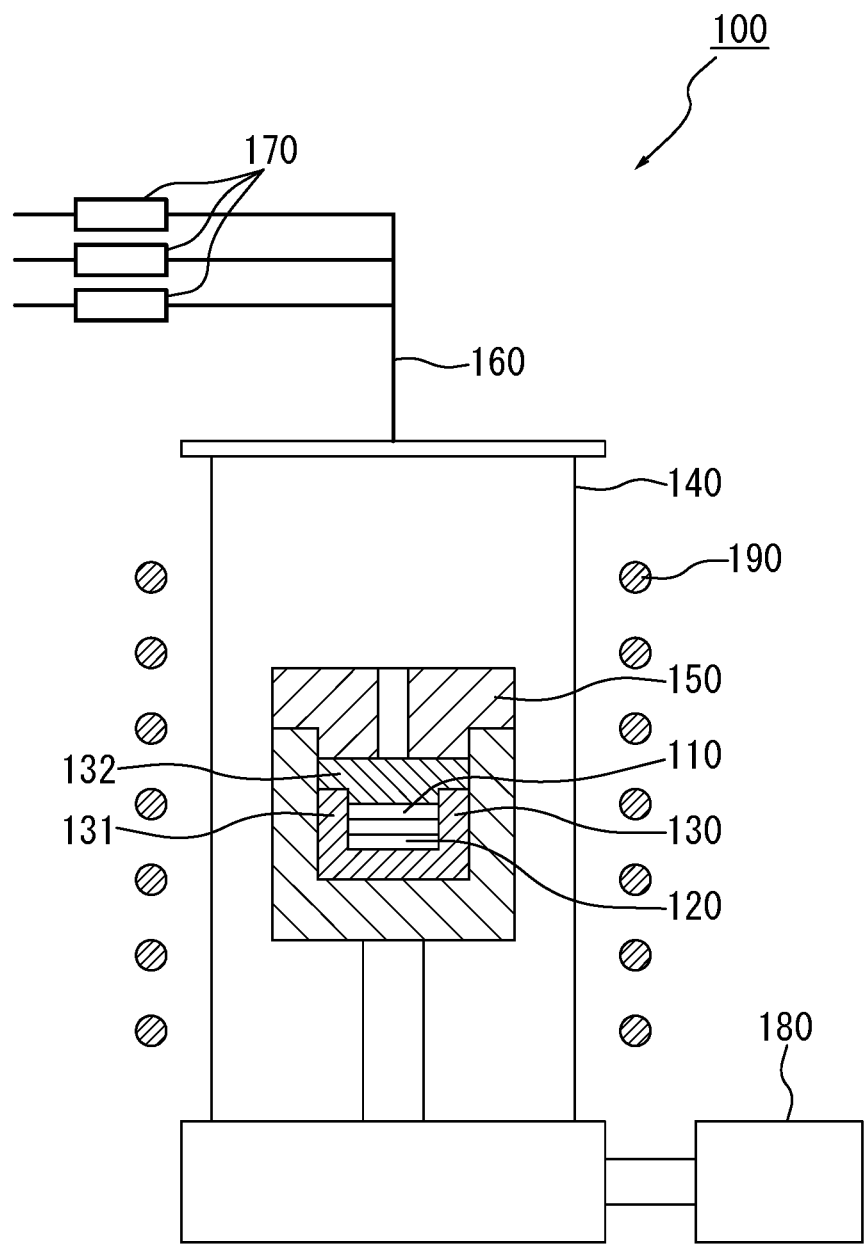
FIG. 8 is an explanatory view of a crystal growth apparatus.

Next, a method for manufacturing a SiC fluorescent material will be described with reference to FIG. 8. FIG. 8 is an explanatory view of a crystal growth apparatus.

As illustrated in FIG. 8, this crystal growth apparatus 100 includes an inner container 130 in which a seed crystal substrate 110 and a raw material 120 are disposed, a storage tube 140 that accommodates the inner container 130, a heat insulating container 150 that covers the inner container 130, an inlet tube 160 for introducing gas into the storage tube 140, a flow meter 170 for measuring a flow rate of the gas introduced from the inlet tube 160, a pump 180 for adjusting the pressure in the storage tube 140, and an RF coil 190 disposed outside the storage tube 140 so as to heat the seed crystal substrate 110.

The inner container 130 is formed of graphite, for example, and includes a crucible 131 having a top opening and a lid 132 that closes the opening of the crucible 131. The seed crystal substrate 110 formed of a single crystal SiC is attached to the inner surface of the lid 132. The raw material 120 for sublimation recrystallization is accommodated inside the crucible 131. In the present embodiment, a powder of a SiC crystal and a powder serving as a source B or a source Al are used as the raw material 120.

When a SiC fluorescent material is manufactured, first, the crucible 131 filled with the raw material 120 is closed by the lid 132 and is disposed inside the storage tube 140 using a support rod formed of graphite, and then, the inner container 130 is covered with the heat insulating container 150. Then, an Ar gas, a $N_2$ gas, and a $H_2$ gas as an atmospheric gas are allowed to flow into the storage tube 140 by the inlet tube tube 160 via the flow meter 170. Subsequently, the raw material 120 is heated using the RF coil 190 and the pressure in the storage tube 140 is controlled using the pump 180.

Specifically, the pressure in the storage tube 140 is controlled between 0.03 Pa and 600 Pa and the initial temperature of the seed crystal substrate 110 is controlled to be at least 1,100° C. The initial temperature is preferably 1,500° C. or lower, and more preferably 1,400° C. or lower. The temperature gradient between the raw material 120 and the seed crystal substrate 110 is set between 1° C. and 10° C.

Subsequently, the seed crystal substrate 110 is heated from the initial temperature to the growth temperature at a heating ratio between 15° C./minute and 25° C./minute. The growth temperature is preferably set between 1,700° C. and 1,900° C. The growth rate is preferably set between 10 μm/hour and 200 μm/hour.

In this way, after sublimation, the raw material 120 is diffused and transported toward the seed crystal substrate 110 due to concentration gradient formed based on temperature gradient. The growth of the SiC fluorescent material is realized when a raw material gas having reached the seed crystal substrate 110 is recrystallized on a seed crystal. The doping concentration in the SiC crystal can be controlled by the addition of an impurity gas in an atmospheric gas during the crystal growth and the addition of an impurity element or a compound thereof to a raw material powder. That is, the first SiC layer 11, the second SiC layer 12, and the third SiC layer 13 which have different doping elements and concentrations can be manufactured continuously.

However, since the amount of added impurity elements or the compound thereof increases when the set concentration of the donor impurity and the acceptor impurity increases, the control accuracy of the impurity concentration deteriorates. When an impurity concentration error increases, absorption or the like occurs due to free-carriers and the luminance efficiency may decrease. That is, the higher the set impurity concentration, the more likely the free-carrier absorption resulting from an impurity concentration error is to occur.

In the present embodiment, a $N_2$ gas is added in the atmospheric gas during the crystal growth and a elemental substance or a compound of B or Al is added to the raw material 120. Furthermore, a $H_2$ gas is added in the atmospheric gas during the crystal growth, thus suppressing substitution of carbon atoms with a donor impurity at the hexagonal site, leading to acceleration of substitution of carbon atoms at the cubic site. This mechanism is considered as follows.

First, hydrogen atom reacts with carbon atom at the atomic step end of a crystal growth surface to form a C—H bond. Subsequently, the bonding force between the carbon atom and the surrounding silicon atom decreases to generate the carbon vacancy due to elimination of carbon atom. As a result, the probability that nitrogen is incorporated into the carbon vacancy increases. Here, since there is a difference in the bonding force surrounding the Si atom between carbon atom at the hexagonal site and the carbon atom at the cubic site, the carbon atom at the cubic site has a weak bonding force, and the carbon vacancy is likely to be generated by a hydrogen atom, thus considering that substitution of carbon atom at the cubic site with nitrogen atom is selectively accelerated.

As described above, in the SiC crystal manufactured through the donor operation step of accelerating substitution of carbon atom at the cubic site with nitrogen atom, as compared to carbon atom at the hexagonal site, in which a SiC fluorescent material is grown by a sublimation method in a hydrogen-containing atmosphere, a ratio of a donor impurity substituting a carbon atom at a cubic site to a donor impurity substituting a carbon atom at a hexagonal site is larger than a ratio of the cubic site to the hexagonal site in a crystal structure.

The SiC crystal manufactured in this manner can improve luminance efficiency upon donor-acceptor pair (DAP) emission because of high ratio of a donor impurity contributing to fluorescence as compared to a conventional one manufactured through no donor operation step. In this case, it is preferable that an absorbance in a visible light region in the SiC crystal is about the same level as that in the case of adding no impurity because of a little donor having a shallow level.

The SiC crystal manufactured in this manner becomes a SiC substrate 10 through the steps such as external grinding, slicing, front surface grinding, front surface polishing, and the like. After that, a group-III nitride semiconductor is epitaxially grown on the SiC substrate 10. In the present embodiment, for example, a buffer layer 21, a first contact layer 22, a first clad layer 23, a multiple-quantum-well active layer 24, an electron blocking layer 25, a second clad layer 26, and a second contact layer 27 are grown by metal organic vapor phase epitaxy. After a nitride semiconductor layer is formed thereon, layers 31 and 32 are formed thereon and the SiC substrate 10 is divided by dicing into a plurality of LED elements 1 to manufacture the LED element 1. Here, the SiC substrate 10 illustrated in FIG. 1 can also be used as a phosphor plate without being used as a substrate of the LED element 1.

Moreover, according to the LED element 1 of the present embodiment, the SiC substrate 10 has the second SiC layer 12 and the third SiC layer 13 in which the boron concentrations are different, and the emission wavelengths in the respective SiC layers 12 and 13 are different. Thus, the color rendering property can be improved while using the same donor impurity and the same acceptor impurity as compared to a case in which the LED element has a sole SiC layer. In this way, it is easy to adjust the color temperature and the color rendering index of a light-emitting device which uses a SiC fluorescent material.

Moreover, according to the light-emitting device 1 of the present embodiment, since the first SiC layer 11, the second SiC layer 12, and the third SiC layer 13 are arranged from the GaN-based semiconductor layer 20 in ascending order of nitrogen concentrations, the SiC layers 11, 12, and 13 are arranged from an excitation light source in descending order of difficulty that free-carriers are generated. In this way, even when the SiC layer having a relatively high concentration is disposed on a side opposite to the excitation light source and free-carriers are generated from the SiC layer having a relatively high concentration due to manufacturing errors, the free-carriers have substantially no influence on the SiC layer having a relatively low concentration. Thus, it is possible to minimize a decrease in the luminance efficiency due to manufacturing errors.

Here, Sample C was actually manufactured such that a ratio of a donor impurity substituting a carbon atom at a cubic site to a donor impurity substituting a carbon atom at a hexagonal site is larger than a ratio of the cubic site to the hexagonal site in a crystal structure in a 6H-type SiC crystal. Moreover, Sample D was manufactured for comparison such that a ratio of a donor impurity substituting a carbon atom at a cubic site to a donor impurity substituting a carbon atom at a hexagonal site is the same as a ratio of the cubic site to the hexagonal site in a crystal structure in a 6H-type SiC crystal.

Specifically, Samples C and D were manufactured using the crystal growth apparatus illustrated in FIG. 8, and nitrogen was used as a donor impurity and boron was used as an acceptor impurity. Nitrogen was added by allowing a $N_2$ gas to be contained in an atmospheric gas during the crystal growth and boron was added by allowing a compound of B to be contained in the raw material 120. More specifically, Samples C and D were manufactured under the conditions of an initial temperature of 1,100° C., a growth temperature of 1,780° C., and a growth rate of 100 µm/hour. Sample C was manufactured by introducing, in addition to an Ar gas and a $N_2$ gas, a $H_2$ gas into the storage tube 140, and setting the pressure in the storage tube 140 to 0.08 Pa. Moreover, Sample D was manufactured by introducing an Ar gas and a $N_2$ gas into a storage tube 140, and setting the pressure in the storage tube 140 at 30 Pa.

A relative emission intensity, a carrier concentration at room temperature, a difference between donor impurity and acceptor impurity, a ratio of Hall to the difference, and a ratio of a donor forming a shallow donor level to a donor forming a deep donor level of Samples C and D manufactured in the above-described manner were measured. The measurement results are illustrated in FIG. 9. FIG. 9 is a table illustrating the relative emission intensity, the carrier concentration at room temperature, a difference between a donor impurity and an acceptor impurity, a ratio of Hall to the difference, and a ratio of a donor forming a shallow donor level to a donor forming a deep donor level of Samples C and D. Here, Hall means the carrier concentration obtained by the Hall effect measurement at room temperature.

As is apparent from FIG. 9, in Sample C, the addition of hydrogen during the crystal growth suppressed substitution of carbon atoms with a donor impurity at the hexagonal site, thus accelerating substitution of carbon atoms at the cubic site. As a result, the emission intensity was increased by four times as compared to Sample D. Regarding Sample C, it is understood that since the carrier concentration at room temperature is smaller than a difference between the donor concentration and the acceptor concentration, and thus accurately donor-acceptor pair emission is performed. Furthermore, in Sample C, it is understood that since a ratio of Hall to the difference between the donor concentration and the acceptor concentration is smaller than that of Sample D, nitrogen as a donor contributes to donor-acceptor pair emission without causing the generation of excess free-carriers, as compared to Sample D.

Figure 10:
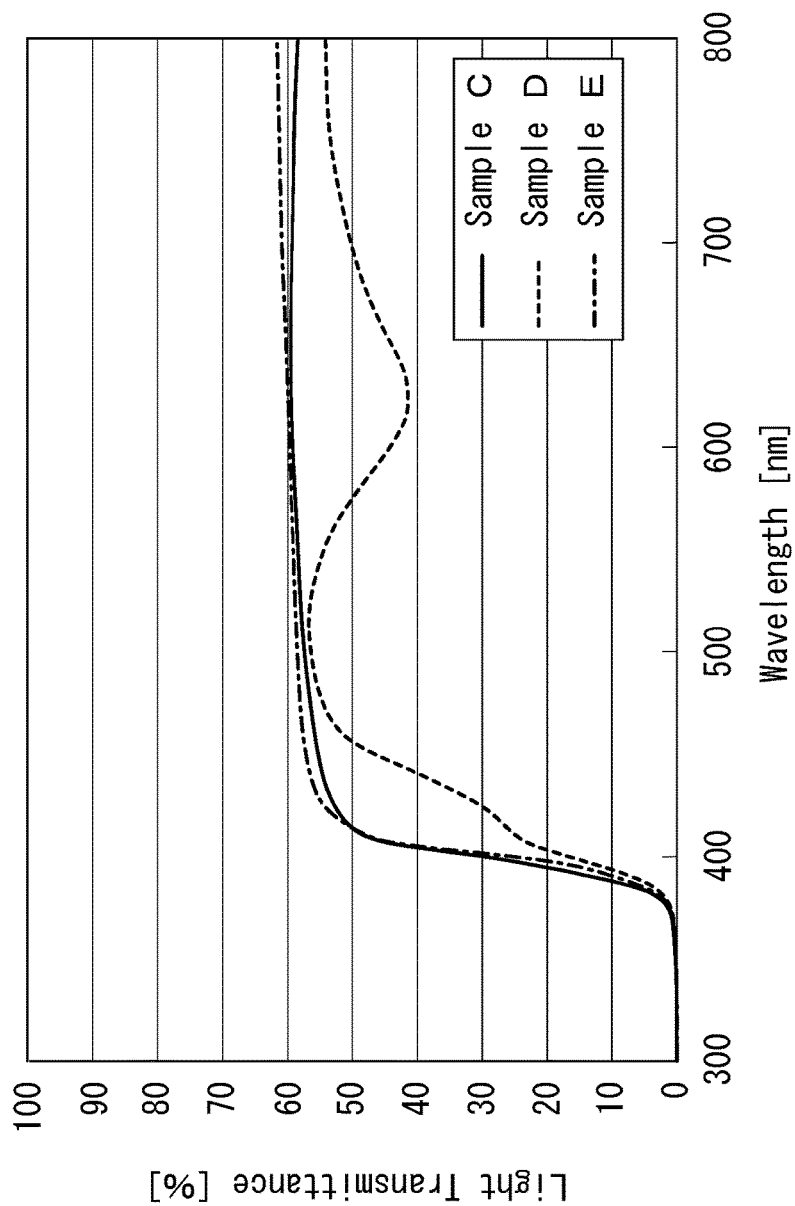
FIG. 10 is a graph illustrating a relation between the wavelength and the light transmittance of Samples C, D, and E.

With respect to Samples C and D, a light transmittance and an absorption coefficient were measured. For comparison, Sample E formed of an impurity-free 6H-type SiC crystal was manufactured and a light transmittance thereof was compared. Here, Sample E was manufactured under the conditions of an initial temperature of 1,100° C., a growth temperature of 1,780° C., and growth rate of 100 µm/hour. FIG. 10 is a graph illustrating relation between the wavelength and the light transmittance of Samples C, D, and E.

As illustrated in FIG. 10, it is understood that a comparatively small amount of donors having a shallow level exist since the light transmittance in a visible light region of Sample C is the same level as that of Sample E in which no impurity is added. In contrast, it is understood that a comparatively large amount of donors having a shallow level exist since the light transmittance in a visible light region of Sample D is smaller than that of Sample E.

In the embodiment, although the first SiC layer 11 in which aluminum and nitrogen are added is formed in the SiC substrate 10, a SiC substrate 110 may include a first SiC layer 11 and a second SiC layer 12 in which the doping concentrations of nitrogen and boron are different, for example, as illustrated in FIG. 11. In this case, the SiC substrate 10 of the light-emitting device 101 emits warm white light.

Moreover, in the embodiment, although the second SiC layer 12 and the third SiC layer 13 are formed so that the impurity concentrations therein are substantially uniform, the concentration of the acceptor impurity may be changed continuously so that the first SiC fluorescent portion and a second SiC fluorescent portion are formed continuously.

Moreover, in the embodiment, although a SiC fluorescent material is obtained by a sublimation method, a SiC fluorescent material may be obtained by a CVD method or the like. Moreover, although a donor impurity is preferentially substituted with a carbon atom in the cubic site by adding a hydrogen gas during the crystal growth, other methods may be used, for example, the same can be realized by accurately controlling the ratio of Si to C. Further, although a donor impurity preferentially substitutes a carbon atom at the cubic site of a 6H-type SiC crystal, the present invention can be applied to other poly-type SiC crystals as long as the crystal includes cubic and hexagonal sites, like a 4H-type SiC crystal.

Moreover, although a combination of N and B and a combination of N and Al are used as a doner-acceptor combination, it is also possible to use other group-V elements and group-III elements such as P, As, Sb, Ga, In, and the like, and it is also possible to use transition metals such as Ti and Cr, and group-II elements such as Be. Further, the donor and acceptor can be appropriately changed if the element can be as a donor impurity and an acceptor impurity in a SiC crystal. In this case, the light-emitting device may include a first SiC fluorescent portion and a second SiC fluorescent portion which are formed of a SiC crystal in which the same donor impurity as the first SiC fluorescent portion and the same acceptor impurity as the first SiC fluorescent portion are added, the concentration of the acceptor impurity is higher than the concentration of the acceptor impurity in the first SiC fluorescent portion, and the emission wavelength is longer than that in the first SiC fluorescent portion.

Figure 12:
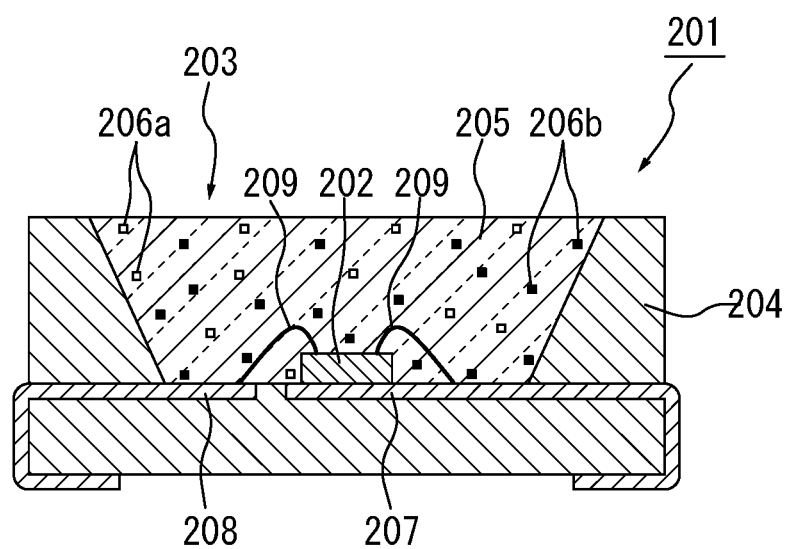
FIG. 12 is a schematic cross-sectional view of a light-emitting device illustrating a second embodiment of the present invention.

FIG. 12 is an overall longitudinal cross-sectional view of a light-emitting device illustrating a second embodiment of the present invention.

As illustrated in FIG. 12, this light-emitting device 201 includes a LED element 202 that emits ultraviolet light and a case 204 having a recess cavity 203 in which the LED element 202 is disposed. A sealing material 205 in which a first SiC phosphor powder 206a and a second SiC phosphor powder 206b are dispersed is filled in the cavity 203. Moreover, the light-emitting device 201 includes a first lead 207 and a second lead 208 which are formed of metal and are exposed to a bottom surface of the cavity 203 of the case 204 and spaced from each other. The LED element 202 is mounted on the first lead 207 and is connected to the leads 207 and 208 by wires 209.

The LED element 202 emits ultraviolet light. The first SiC phosphor powder 206a and the second SiC phosphor powder 206b are formed of a 6H-type SiC crystal, and the doping concentrations of nitrogen and boron in the first SiC phosphor powder 206a are different from those in the second SiC phosphor powder 206b. The boron concentration in the first SiC phosphor powder 206a is lower than the boron concentration in the second SiC phosphor powder 206b. In the present embodiment, the boron concentration in the first SiC phosphor powder 206a is lower than $5\times10^{18}/cm^3$ and the nitrogen concentration is higher than the boron concentration. Moreover, the boron concentration in the second SiC phosphor powder 206b is higher than $5\times10^{18}/cm^3$ and the nitrogen concentration is higher than the boron concentration. In the first SiC phosphor powder 206a and the second SiC phosphor powder 206b, the concentration of the donor impurity is higher than the concentration of the acceptor impurity, and a difference in concentration is $1\times10^{18}/cm^3$ or lower.

The sealing material 205 filled in the cavity 203 is formed of a light-transmitting material and examples of usable materials include a heat-curable resin such as an epoxy resin, a modified epoxy resin, a silicone resin, or a modified silicone resin and an inorganic material such as glass. In the present embodiment, the sealing material 205 is formed of a heat-curable silicone resin and is filled in the cavity 203 by potting in a state of containing the SiC phosphor powders 206a and 206b and is then cured by heating.

In the light-emitting device 201 having such a configuration, when a voltage is applied to the LED element 202, ultraviolet light is emitted from the LED element 202. The ultraviolet light incident on the SiC phosphor powders 206a and 206b is converted to warm white light.

The light-emitting device 201 of the present embodiment includes the first SiC phosphor powder 206a and the second SiC phosphor powder 206b in which the boron concentrations are different, and the emission wavelengths in the respective SiC phosphor powders 206a and 206b are different. Thus, the color rendering property can be improved while using the same donor impurity and the same acceptor impurity as compared to a case in which the light-emitting device has a sole SiC phosphor powder.

Figure 13:
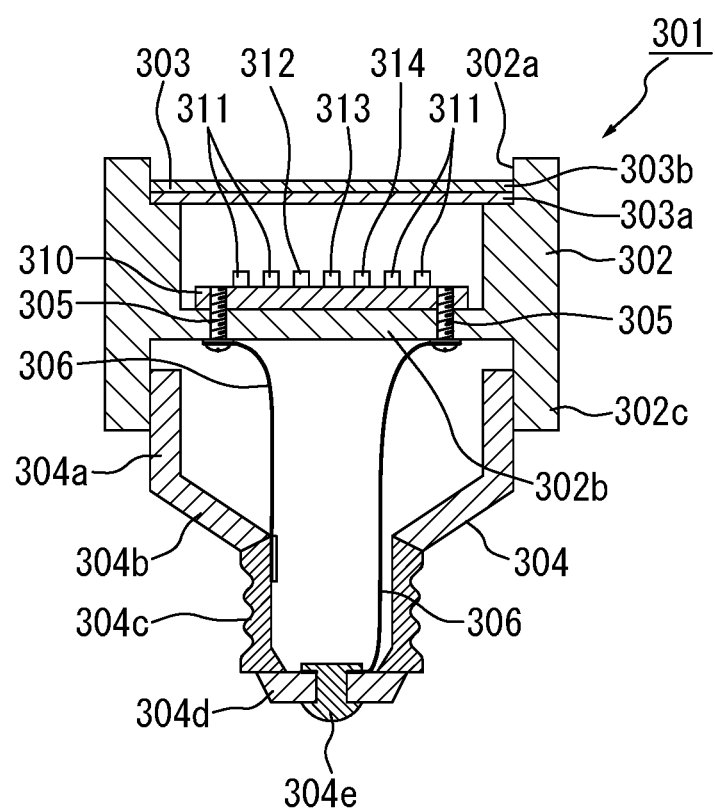
FIG. 13 is an overall longitudinal cross-sectional view of a light-emitting device illustrating a third embodiment of the present invention.

FIG. 13 is an overall longitudinal cross-sectional view of a light-emitting device illustrating a third embodiment of the present invention.

As illustrated in FIG. 13, the light-emitting device 301 includes a cylindrical housing 302 having an opening 302a formed at one end, a SiC fluorescent plate 302 that blocks the opening 302a, and a terminal portion 304 formed at the other end of the housing 302. In the present embodiment, it is assumed that one end side of the housing 302 is the upper side and the other end side is the lower side. A plurality of LED elements supplied with electric power from the terminal portion 304 is accommodated in the housing 302, and the SiC fluorescent plate 303 emits light by being excited by ultraviolet light emitted from the LED element. The blue, green, and red light emitted from the LED element pass through the SiC phosphor 303 without wavelength conversion.

The housing 302 is formed of an inorganic material and has a blocked lower end, and the blocked portion forms a bottom portion 302b. The housing 302 is formed of ceramic and is MN, in the present embodiment. A mounting substrate 310 on which a ultraviolet LED element 311, a blue LED element 312, a green LED element 313, and a red LED element 314 are mounted is fixed to the bottom portion 302b. Although a method of fixing the mounting substrate 310 is optional, in the present embodiment, the mounting substrate 310 is fixed by screws 305 that are fastened into the bottom portion 302b. The opening 302a of the housing 302 is formed in a step form, and the SiC fluorescent plate 303 is fixed to the step-shaped portion. Moreover, the housing 302 has a flange 302c that protrudes downward from the bottom portion 302b. In the present embodiment, the flange 302c is formed in a circumferential direction.

The terminal portion 304 is formed of an inorganic material and is configured to be fastened to a predetermined socket that supplies electric power. The terminal portion 304 includes a cylindrical portion 304a fixed to an inner circumferential surface of the flange 302c of the housing 302, an inclined portion 304b formed continuous to the lower end of the cylindrical portion 304a and inclined downward, a first electrode 304c provided in the lower end of the inclined portion 304b and having a male screw formed on an outer surface thereof, an insulating portion 304d formed continuous to the lower end of the first electrode 304c so as to extend inward in a radial direction, and a second electrode 304e that blocks the inner side in the radial direction of the insulating portion 304d. The cylindrical portion 304a, the inclined portion 304b, and the insulating portion 304d are formed of ceramic having insulating properties and the first electrode 304c and the second electrode 304e are formed of metal having conductive properties. The cylindrical portion 304a, the inclined portion 304b, and the insulating portion 304d are preferably formed of the same material as the housing 302. The first electrode 304c and the second electrode 304e are electrically connected to the screws 305 by inner conductive wires 306. In the present embodiment, the screws 305 are formed of metal having conductive properties, and when the screws 305 are fastened to the mounting substrate 310, the screws 305 are electrically connected to a wiring pattern of the mounting substrate 310.

The SiC fluorescent plate 303 is formed in a planar form using a 6H-type SiC crystal. The SiC fluorescent plate 303 includes a first SiC layer 303a and a second SiC layer 303b in which the doping concentrations of nitrogen and boron are different. The boron concentration in the first SiC layer 303a is lower than the boron concentration in the second SiC layer 303b. In the present embodiment, the boron concentration in the first SiC layer 303a is lower than $5\times10^{18}/cm^3$ and the nitrogen concentration thereof is higher than the boron concentration. Moreover, the boron concentration in the second SiC layer 303b is higher than $5\times10^{18}/cm^3$, and the nitrogen concentration thereof is higher than the boron concentration. In the first SiC layer 303a and the second SiC layer 303b, the concentration of the donor impurity is higher than the concentration of the acceptor impurity, and a difference in concentration is $1\times10^{18}/cm^3$ or lower. The first SiC layer 303a and the second SiC layer 303b are arranged from the ultraviolet LED element 311 which is an excitation light source in descending order of nitrogen concentrations.

In the light-emitting device 301 having such a configuration, when the terminal portion 304 is fastened to an external socket, a state in which electric power can be supplied to the respective LED elements 311, 312, 313, and 314 is created. When electric current is applied to the LED elements 311, 312, 313, and 314, light of predetermined wavelengths is emitted from the respective LED elements 311, 312, 313, and 314.

Ultraviolet light emitted from the ultraviolet LED element 311 is incident on the SiC fluorescent plate 303 and is converted to white light by being absorbed by the SiC fluorescent plate 303. After that, white light is outputted outside the device from the SiC fluorescent plate 303. Moreover, the visible light (in the present embodiment, blue, green, and red light) emitted from the LED elements 312, 313, and 314 excluding the ultraviolet LED element 311 is incident on the SiC fluorescent plate 303 and is output outside the device from the SiC fluorescent plate 303 without wavelength conversion.

When the LED elements 311, 312, 313, and 314 are energized, a mixture of the warm white light resulting from fluorescence of the SiC fluorescent plate 303 and the blue, green, and red light having passed through the SiC fluorescent plate 303 is output outside. Thus, the blue, green, and red components in addition to the pure white fluorescence of the SiC fluorescent plate 303 can be compensated by the blue LED element 312, the green LED element 313, and the red LED element 314, and white light having a very high color rendering property can be obtained.

Moreover, according to the light-emitting device 301 of the present embodiment, the SiC fluorescent plate 303 has the first SiC layer 303a and the second SiC layer 303b in which the boron concentrations are different, and the emission wavelengths in the respective SiC layers 303a and 303b are different. Thus, the color rendering property can be improved while using the same donor impurity and the same acceptor impurity as compared to a case in which the LED element has a sole SiC layer.

Moreover, according to the light-emitting device 301 of the present embodiment, since the first SiC layer 303a and the second SiC layer 303b are arranged from the ultraviolet LED element 311 in ascending order of nitrogen concentrations, the SiC layers 303a and 303b are arranged from an excitation light source in descending order of difficulty that free-carriers are generated. In this way, even when the SiC layer having a relatively high concentration is disposed on a side opposite to the excitation light source and free-carriers are generated from the SiC layer having a relatively high concentration due to manufacturing errors, the free-carriers have substantially no influence on the SiC layer having a relatively low concentration. Thus, it is possible to minimize a decrease in the luminance efficiency due to manufacturing errors.

For example, as illustrated in FIG. 14, the mounting substrate 310 may be configured as a SiC fluorescent substrate 410. FIG. 14 is a schematic cross-sectional view of a light-emitting device illustrating a fourth embodiment of the present invention. In a light-emitting device 401 illustrated in FIG. 14, the opening 302a of the housing 302 is blocked by a transparent lens 403 instead of the SiC fluorescent plate 303.

The SiC fluorescent substrate 410 includes a first SiC layer 410a and a second SiC layer 410b in which the doping concentrations of nitrogen and boron are different. The boron concentration in the first SiC layer 410a is lower than the boron concentration in the second SiC layer 410b. In the present embodiment, the boron concentration in the first SiC layer 410a is lower than $5\times10^{18}/cm^3$ and the nitrogen concentration thereof is higher than the boron concentration. Moreover, the boron concentration in the second SiC layer 410b is higher than $5\times10^{18}/cm^3$, and the nitrogen concentration thereof is higher than the boron concentration. In the first SiC layer 410a and the second SiC layer 410b, the concentration of the donor impurity is higher than the concentration of the acceptor impurity, and a difference in concentration is $1\times10^{18}/cm^3$ or lower. The first SiC layer 410a is formed close to the mounting surface of the LED elements 311, 312, 313, and 314, and the second SiC layer 410b is formed on a side opposite the mounting surface of the LED elements 311, 312, 313, and 314. That is, the first SiC layer 410a and the second SiC layer 410b are arranged from the ultraviolet LED element 311 which is an excitation light source in descending order of nitrogen concentrations.

The lens 403 is formed of glass, and an emission surface thereof has an upwardly convex shape and condenses light emitted from the housing 302. Here, when ultraviolet light is included in the light that passes through the glass, the glass blocks 70% or more of the ultraviolet light, for example. Moreover, in the present embodiment, a multi-layer reflection film (DBR film) formed of an inorganic material so as to reflect light emitted from the ultraviolet LED element 311 is formed on the inner surface of the housing 302 of the lens 403. The multi-layer reflection film may be comprised of $SiO_2$ and $TiO_2$, for example. An inorganic material having higher reflectivity than glass in relation to ultraviolet light rather than the multi-layer reflection film may be applied to the inner surface of the glass of the lens 403.

In the light-emitting device 401 having such a configuration, when the LED elements 311, 312, 313, and 314 are energized, a mixture of the warm white light resulting from fluorescence of the SiC fluorescent substrate 410 and the blue, green, and red light emitted from the LED elements 312, 313, and 314 is outputted outside. Thus, the blue, green, and red components in addition to the pure white fluorescence of the SiC fluorescent substrate 410 can be compensated by the blue LED element 312, the green LED element 313, and the red LED element 314, and white light having a very high color rendering property can be obtained.

Moreover, according to the light-emitting device 401 of the present embodiment, the SiC fluorescent substrate 410 has the first SiC layer 410a and the second SiC layer 410b in which the boron concentrations are different, and the emission wavelengths in the respective SiC layers 410a and 410b are different. Thus, the color rendering property can be improved while using the same donor impurity and the same acceptor impurity as compared to a case in which the LED element has a sole SiC layer.

Moreover, according to the light-emitting device 401 of the present embodiment, since the first SiC layer 410a and the second SiC layer 410b are arranged from the ultraviolet LED element 311 in ascending order of nitrogen concentrations, the SiC layers 410a and 410b are arranged from an excitation light source in descending order of difficulty that free-carriers are generated. In this way, even when the SiC layer having a relatively high concentration is disposed on a side opposite to the excitation light source and free-carriers are generated from the SiC layer having a relatively high concentration due to manufacturing errors, the free-carriers have substantially no influence on the SiC layer having a relatively low concentration. Thus, it is possible to minimize a decrease in the luminance efficiency due to manufacturing errors.

FIGS. 15 to 20 illustrate a fifth embodiment of the present invention, and FIG. 15 is an overall side view of a light-emitting device.

As illustrated in FIG. 15, this light-emitting device 501 includes a glass housing 502 and a terminal portion 504 formed on a lower side of the housing 502 and electrically connected to an external power supply and a package substrate 503 is accommodated in the housing 502. The package substrate 503 is supported by a supporting portion 505 extending from the terminal portion 504 and formed of an inorganic material and is electrically connected to the terminal portion 504 by inner conductive wires 506.

FIG. 16 is a plan view of a package substrate.

As illustrated in FIG. 16, the package substrate 503 is a chip-on-board-type substrate on which a plurality of LED elements 1, 540, and 550 are directly mounted. A light-emitting device 501 includes the package substrate 503, a circuit pattern 520 formed on the package substrate 503, and the plurality of LED elements 1, 540, and 550 mounted on the package substrate 503. Moreover, the light-emitting device 501 includes a sealing resin 570 (see FIG. 17) that seals the LED elements 1, 540, and 550 on the package substrate 503. The package substrate 503 is directly connected to the inner conductive wires 506.

Although the material of the package substrate 503 is optional, MN, Si, Cu, $Al_2O_3$, SiC, and the like are used, for example. A synthetic resin such as a glass epoxy, for example, may be used for the package substrate 503. In the present embodiment, the package substrate 503 is formed in a square form, and the LED elements 1, 540, and 550 are disposed so as to be aligned in vertical and horizontal directions.

The circuit pattern 520 includes a pair of anode and cathode electrodes 521 and 522 and supplies electric power to the LED elements 1, 540, and 550. Moreover, the circuit pattern 520 includes series connection portions 523 in which the LED elements 1, 540, and 550 are arranged in series and a parallel connection portion 524 in which both ends of each series connection portion 523 are connected to the anode electrode 521 or the cathode electrode 522. In the present embodiment, nine LED elements 1, 540, and 550 in total are used so that three series connection portions 523 in which three LED elements 1, 540, and 550 are arranged are connected by the parallel connection portion 524, and three lines of such LED elements are arranged in each of the vertical and horizontal directions. In the present embodiment, three types of LED elements including the LED element 1, the second SiC fluorescent LED element 540, and the blue LED element 550 are used.

Figure 17:
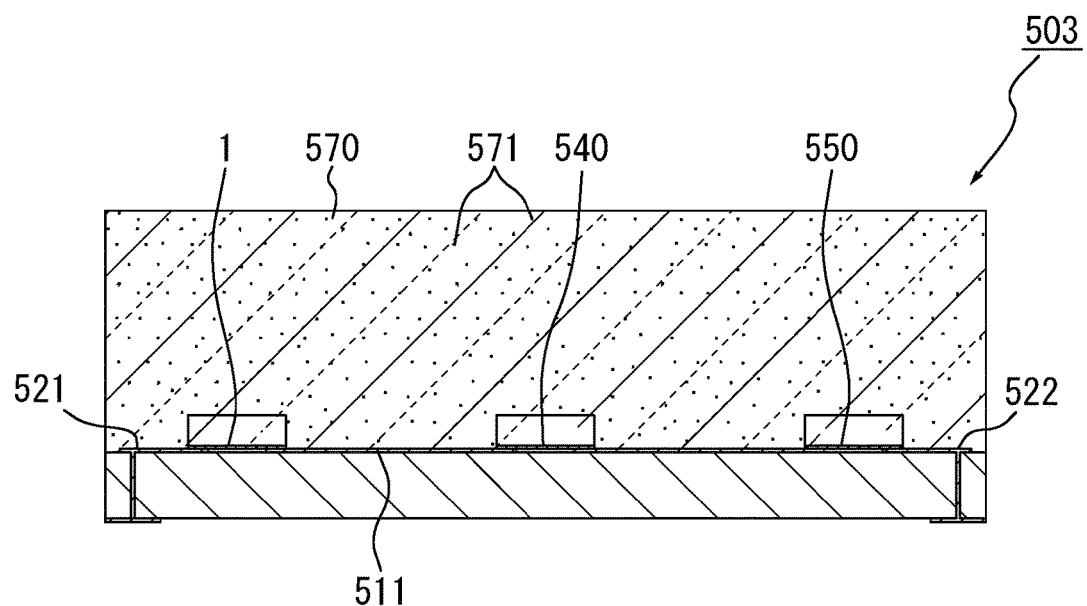
FIG. 17 is a cross-sectional view of a package substrate.

FIG. 17 is a cross-sectional view of a package substrate.

As illustrated in FIG. 17, the LED elements 1, 540, and 550 on the package substrate 503 are sealed by the sealing resin 570. The sealing resin 570 may be comprised of a transparent resin such as an epoxy-based resin or a silicone-based resin. Moreover, the sealing resin 570 contains a phosphor 571 that emits yellow light when excited by blue light emitted from the blue LED element 550. Examples of the phosphor 571 that emits yellow light when excited by blue light include a YAG (Yttrium Aluminum Garnet)-based phosphor and a silicate-based phosphor.

The LED element 1 as the first SiC fluorescent LED element has the same configuration as the LED element 1 of the first embodiment.

Figure 18:
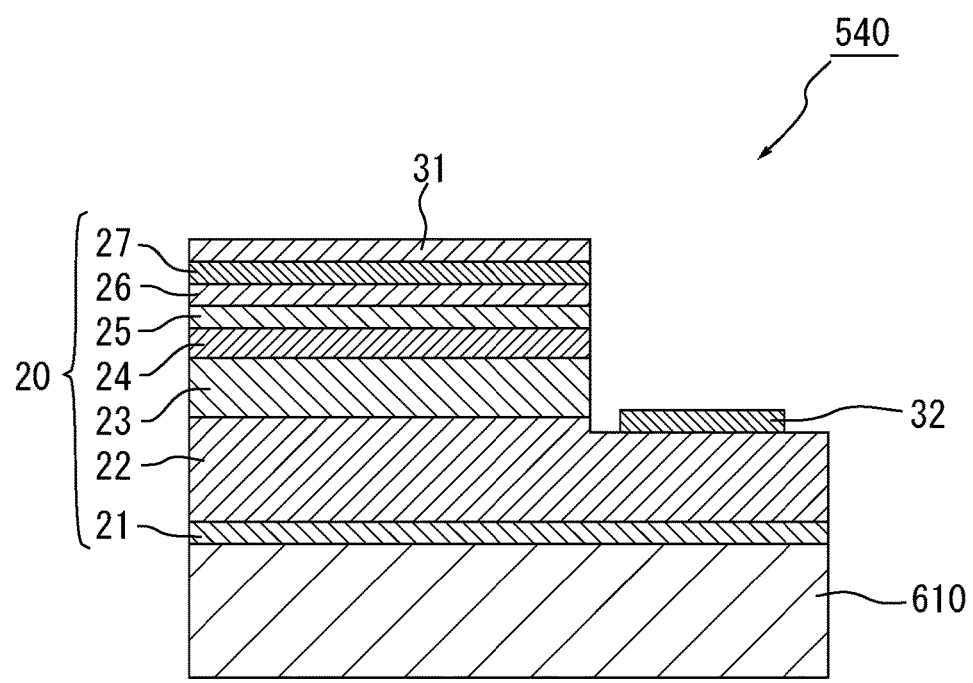
FIG. 18 is a schematic cross-sectional view of a second SiC fluorescent LED element.

FIG. 18 is a schematic cross-sectional view of the second SiC fluorescent LED element.

As illustrated in FIG. 18, the second SiC fluorescent LED element 540 includes a SiC substrate 610 that contains a donor impurity and an acceptor impurity and the GaN-based semiconductor layer 20 formed on the SiC substrate 610. When light is incident from the GaN-based semiconductor layer 20 to the SiC substrate 610, the incident light is absorbed by the SiC substrate 610 to produce fluorescence corresponding to an impurity level. Here, since the GaN-based semiconductor layer 20 and the electrodes 31 and 23 have the same configuration as those of the LED element 1 as the first SiC fluorescent LED element except that the emission wavelength in the multiple-quantum-well active layer 24 is 355 nm, the detailed description thereof will not be provided.

The SiC substrate 610 is formed of a 4H-type SiC crystal having a periodic structure every four layers, and contains nitrogen as a donor impurity and also contains boron as an acceptor impurity. A method for manufacturing the SiC substrate 610 is optional and, for example, the SiC substrate can be manufactured by growing a SiC crystal using a sublimation method or a chemical vapor deposition method.

The cubic site accounts for half of the 4H-type SiC crystal while the hexagonal site accounts for half thereof. Commonly, nitrogen as the donor impurity is disposed in each site in the same proportion as the presence proportion. In other words, in the case of 4H-type SiC, half of the nitrogen substitutes the carbon atom at the cubic site and half of the nitrogen substitutes the carbon atom at the hexagonal site. However, since the SiC crystal of the present embodiment is manufactured through the step of operating a donor so as to increase the concentration of a donor impurity in the cubic site, a ratio of a donor impurity substituting a carbon atom at a cubic site to a donor impurity substituting a carbon atom at a hexagonal site is larger than a ratio of the cubic site to the hexagonal site in a crystal structure.

When a forward voltage is applied to the p-electrode 31 and the n-electrode 32 of the second SiC fluorescent LED element 540 having such a configuration, an electric current is injected into the GaN-based semiconductor layer 20 and light having a peak wavelength in a near-ultraviolet region is emitted from the multiple-quantum-well active layer 24. The emitted near-ultraviolet rays are incident on the SiC substrate 610 doped with an acceptor impurity and a donor impurity, and almost all of near-ultraviolet rays are absorbed therein. In the SiC substrate 610, when donor electrons and acceptor holes are recombined using near-ultraviolet rays as excitation light, green fluorescence is produced.

Figure 19:
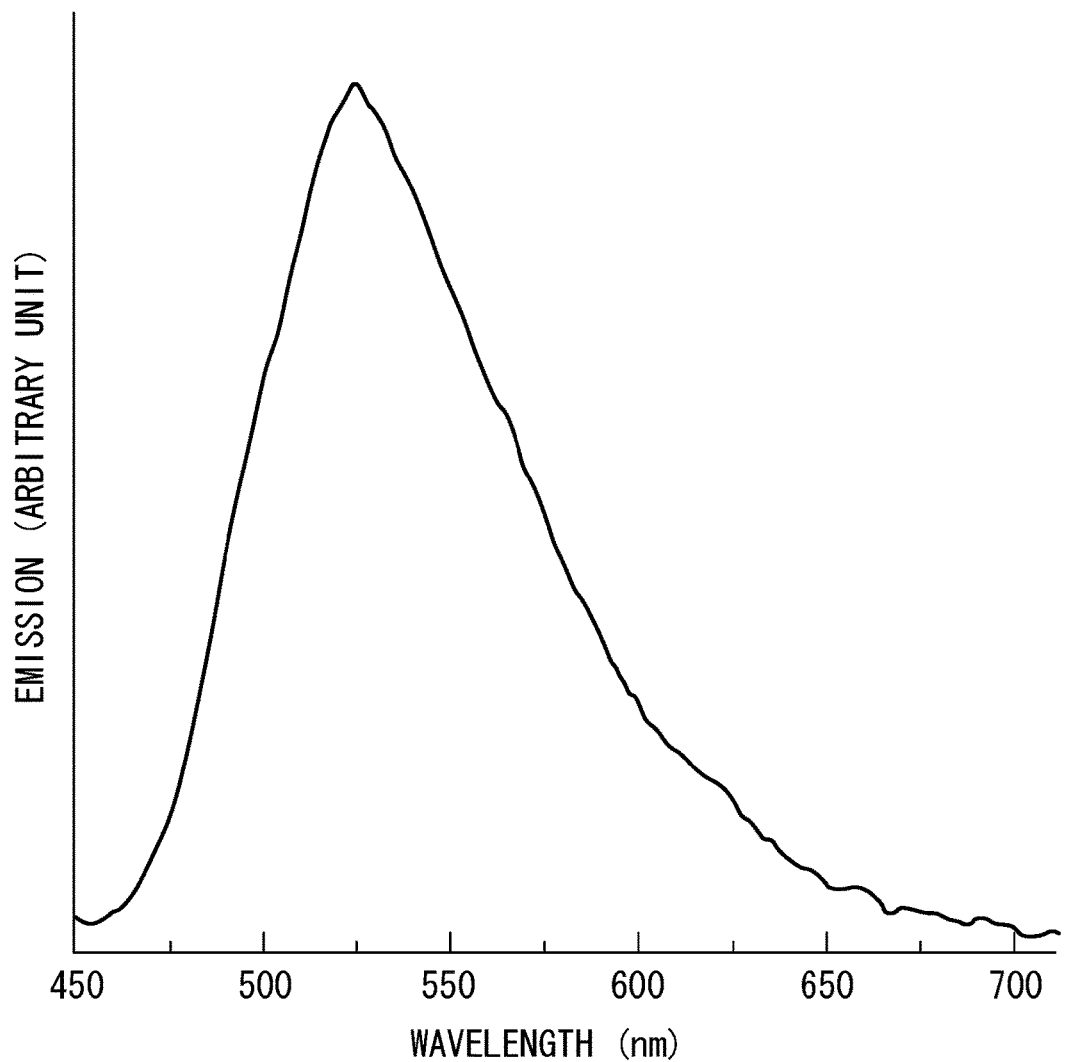
FIG. 19 is a graph illustrating the relation between the wavelength and the emission intensity when boron and nitrogen are doped in 4H-type SiC.

FIG. 19 is a graph illustrating the relation between the wavelength and the emission intensity when boron and nitrogen are doped in 4H-type SiC. Here, this sample was manufactured by setting the boron concentration to $3.5 \times 10^{18}/cm^3$ and the nitrogen concentration to $4.5 \times 10^{18}/cm^3$. As illustrated in FIG. 19, the peak wavelength in this sample was 526 nm.

Similarly the LED element 1 as the first SiC fluorescent LED element, the second SiC fluorescent LED element 540 can improve luminance efficiency upon donor-acceptor pair (DAP) emission because of a high ratio of a donor impurity contributing to fluorescence as compared to a conventional one manufactured through a no donor operation step.

FIG. 20 is a schematic cross-sectional view of a blue LED element.

As illustrated in FIG. 20, the blue LED element 550 includes a sapphire substrate 710 and a GaN-based semiconductor layer 20 formed on the sapphire substrate 710. Here, since the GaN-based semiconductor layers 20 and the electrodes 31 and 23 have the same configuration as those of the LED element 1 as the first SiC fluorescent LED element except that the emission wavelength in the multiple-quantum-well active layer 24 is 465 nm, the detailed description thereof will not be provided.

In the light-emitting device 501 having such a configuration, when electric current is applied to an anode electrode 521 and a cathode electrode 522 of the circuit pattern 520, light of a predetermined wavelength is emitted from the LED elements 1, 540, and 550, and a yellow phosphor 571 and white light is emitted from the light-emitting device 501. Moreover, since the third SiC layer 13 of the LED element 1 as the first SiC fluorescent LED element is formed of a SiC phosphor in which the boron concentration is higher than $5 \times 10^{18}/cm^3$, it is possible to emit red light efficiently and to easily adjust the color temperature and the color rendering index of a light-emitting device which uses a SiC fluorescent material. That is, it is not necessary to use a red LED having an active layer that emits red light unlike the conventional technique, and the half-width value of the red light source can be increased to be larger than that which uses an active layer. Moreover, a SiC phosphor provides better temperature characteristics than a red LED which has an active layer that emits red light, and the attenuation rate of a red component during use can be suppress as much as possible.

In the conventional light-emitting device which uses a plurality of LED elements, although light emitted from an active layer of a red LED element is directly used as the light emitted in a red region, the light emitted from the active layer has a small half-width value and is not desirable for generation of white light. Thus, the inventors have further studied intensively about how to effectively emit white light using a SiC fluorescent material. In the present embodiment, it is possible to provide the light-emitting device 501 capable of efficiently emit light in the red region using a SiC fluorescent material.

In the present embodiment, as for the blue region, blue light having a first peak wavelength and a second peak wavelength is emitted from the third SiC layer 13 of the LED element 1 as the first SiC fluorescent LED element and blue light having a third peak wavelength is emitted from the blue LED element 550. Moreover, as for the green region, green light is emitted from the SiC substrate 610 of the second SiC fluorescent LED element 540. Further, as for the yellow region, yellow light is emitted from the yellow phosphor 571. Furthermore, as for the orange region, orange light is emitted from the second SiC layer 12 of the LED element 1 as the first SiC fluorescent LED element. Furthermore, as for the red region, red light is emitted from the third SiC layer 13 of the LED element 1 as the first SiC fluorescent LED element.

As described above, since the light-emitting device has a light emission source over the entire visible region, it is possible to obtain white light having a very high color rendering property. Moreover, it is possible to appropriately adjust the emission intensity of blue, green, yellow, orange, and red light and to set the color temperature and the color rendering index (CRI) to optional values. The color temperature can be adjusted in the range between 2500K and 6000K and the color rendering index can be adjusted in the range between 70 and 99.

In the fifth embodiment, although the chip-on-board-type light-emitting device 501 in which the LED elements 1, 540, and 550 are directly mounted on the package substrate 503 is illustrated, the LED elements 1, 540, and 550 may be mounted on mounting substrates, respectively, and the mounting substrates may be mounted on a package substrate. In this case, the blue LED element 550 is preferably sealed on a mounting substrate, and the yellow phosphor 571 is preferably contained in a sealing material such as a resin.

Moreover, in the fifth embodiment, although the SiC fluorescent material that emits red light is used as the substrate of the LED element, the SiC fluorescent material that emits red light, for example, may be contained in the sealing material, and the arrangement of the SiC fluorescent material that emits red light may be changed arbitrarily.

Moreover, in the fifth embodiment, instead of the SiC substrate 10 in which the first SiC layer 11 in which aluminum and nitrogen are added is formed, the SiC substrate 10 may include two SiC layers in which the doping concentrations of nitrogen and boron are different and may include only one SiC layer, for example. Further, the second SiC fluorescent LED element 540 may be omitted, and instead of this, a green phosphor may be contained in the sealing material 570. Furthermore, the blue LED 550 may be omitted, and light in a blue region may be emitted by only the first SiC layer 11 of the LED element 1 as the first SiC fluorescent LED element.

Figure 21:
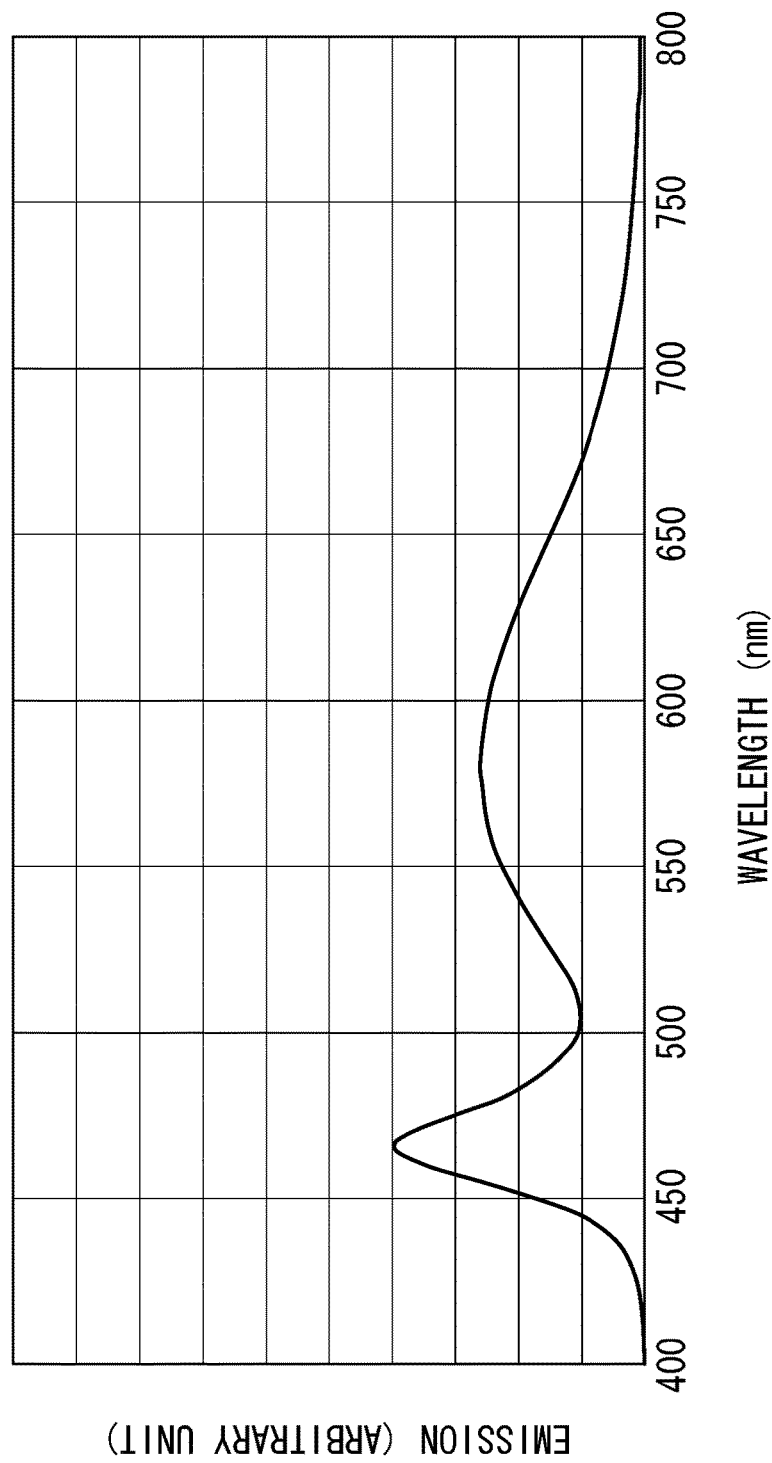
FIG. 21 is a graph illustrating the relation between the wavelength and the emission intensity illustrating a first example.

FIG. 21 is a graph illustrating the relation between the wavelength and the emission intensity illustrating a first example.

The first example illustrates the emission spectrum when the first SiC layer 11 as the 6H-type SiC blue fluorescent portion and the second SiC layer 12 as the 6H-type SiC orange fluorescent portion are omitted and the LED element 1 as the first SiC fluorescent LED element in which the SiC substrate 10 includes the third SiC layer 13 only as the 6H-type SiC red fluorescent portion, the blue LED 550, and a YAG phosphor that is excited by blue light are used. In the example of this spectrum the color temperature was 4460K and the CRI was 83.0.

Figure 22:
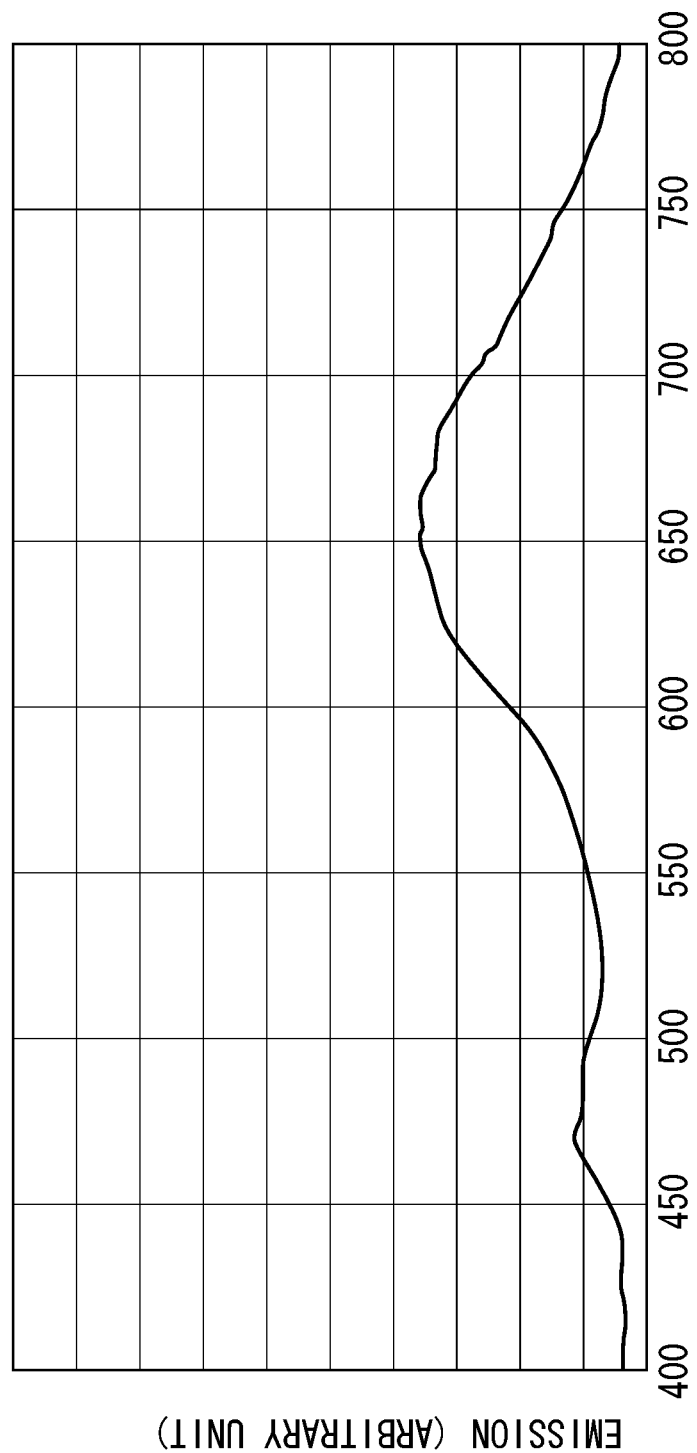
FIG. 22 is a graph illustrating the relation between the wavelength and the emission intensity illustrating a second example.

FIG. 22 is a graph illustrating the relation between the wavelength and the emission intensity illustrating a second example.

The second example illustrates the emission spectrum of the LED element 1 as the first SiC fluorescent LED element having the SiC substrate 10 which includes the first SiC layer 11 as the 6H-type SiC blue fluorescent portion, the second SiC layer 12 as the 6H-type SiC orange fluorescent portion, and the third SiC layer 13 as the 6H-type SiC red fluorescent portion. According to this configuration, it is understood that white light is emitted by the LED element 1 only as the first SiC fluorescent LED element. In the example of this spectrum the color temperature was 2661K and the CRI was 91.9.

Figure 23:
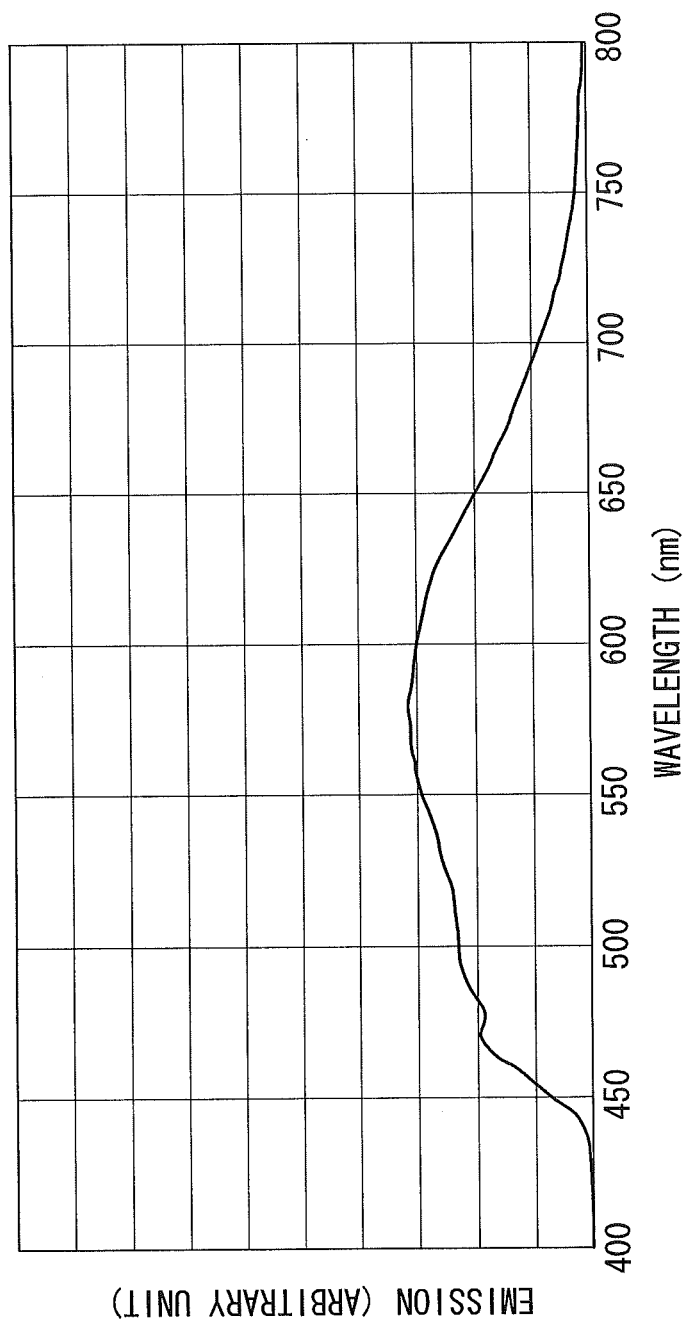
FIG. 23 is a graph illustrating the relation between the wavelength and the emission intensity illustrating a third example.

FIG. 23 is a graph illustrating the relation between the wavelength and the emission intensity illustrating a third example.

The third example illustrates the emission spectrum when the second SiC layer 12 as the 6H-type SiC orange fluorescent portion is omitted and the LED element 1 as the first SiC fluorescent LED element in which the SiC substrate 10 includes the first SiC layer 11 as the 6H-type SiC blue fluorescent portion and the third SiC layer 13 as the 6H-type SiC red fluorescent portion and the second SiC fluorescent LED element 540 are used. In the example of this spectrum the color temperature was 3538K and the CRI was 85.0.

Figure 24:
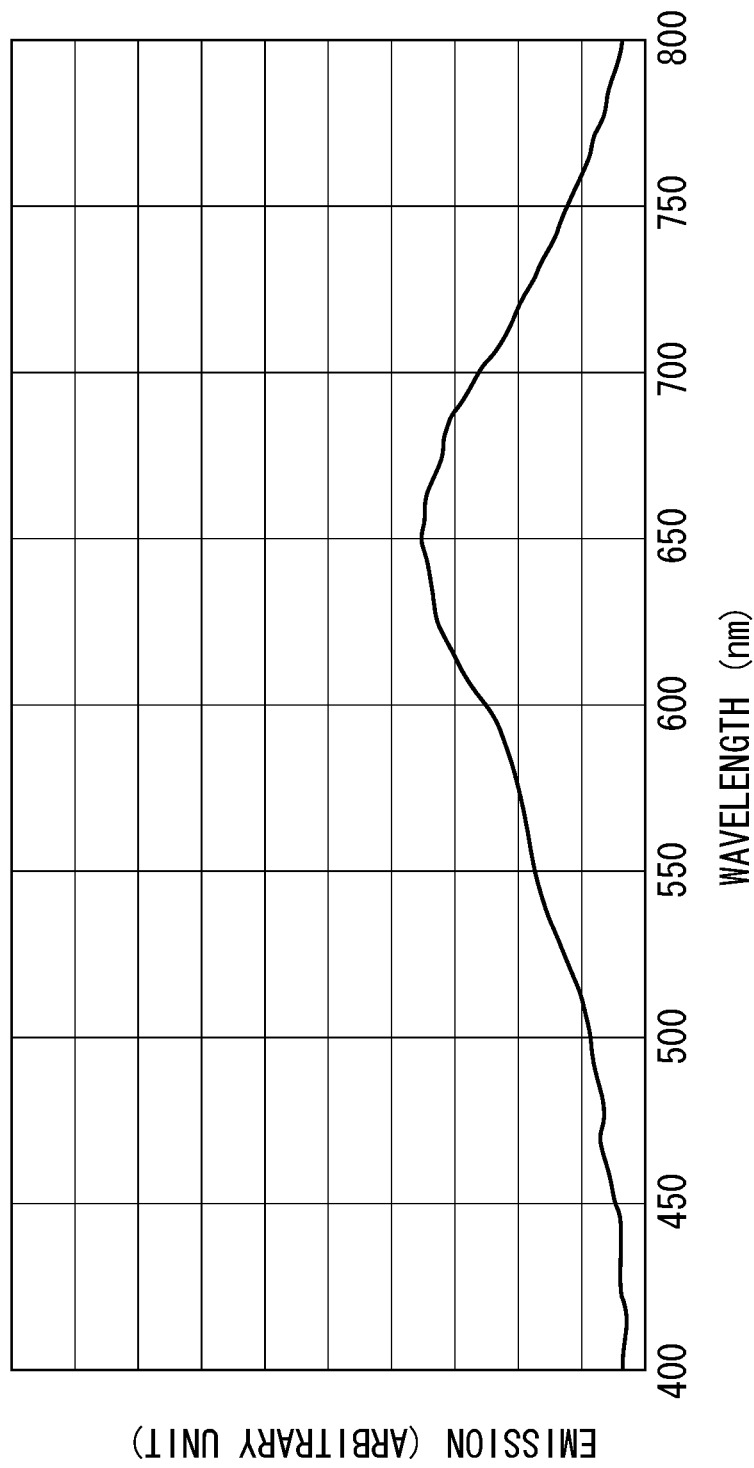
FIG. 24 is a graph illustrating the relation between the wavelength and the emission intensity illustrating a fourth example.

FIG. 24 is a graph illustrating the relation between the wavelength and the emission intensity illustrating a fourth example.

The fourth example illustrates the emission spectrum when the LED element 1 as the first SiC fluorescent LED element which includes the first SiC layer 11, the second SiC layer 12, and the third SiC layer 13, the second SiC fluorescent LED element 540, the blue LED 550, and a YAG phosphor that is excited by blue light are used. In the example of this spectrum the color temperature was 2509K and the CRI was 98.6.

INDUSTRIAL APPLICABILITY

The light-emitting device according to the present invention is industrially useful because the light-emitting device can improve the color rendering property.

REFERENCE SIGNS LIST

1 LED element
10 SiC substrate
11 First SiC layer
12 Second SiC layer
13 Third SiC layer
20 GaN-based semiconductor layer
24 Multiple-quantum-well active layer
101 Light-emitting device
201 Light-emitting device
202 LED element
206a First SiC phosphor powder
206b Second SiC phosphor powder
301 Light-emitting device
303 SiC fluorescent plate
303a First SiC layer
303b Second SiC layer
311 Ultraviolet LED element
401 Light-emitting device
410 SiC fluorescent substrate
410a First SiC layer
410b Second SiC layer
501 Light-emitting device
540 Second SiC fluorescent LED element
550 Blue LED element
610 SiC substrate

The invention claimed is:

1. A light-emitting device comprising:
a first SiC fluorescent portion in which a donor impurity and an acceptor impurity are added and which is formed of a SiC crystal;
a second SiC fluorescent portion which is formed of a SiC crystal in which the same donor impurity as the first SiC fluorescent portion and the same acceptor impurity as the first SiC fluorescent portion are added, and in which a concentration of the acceptor impurity is higher than the concentration of the acceptor impurity in the first SiC fluorescent portion and an emission wavelength is longer than that of the first SiC fluorescent portion; and
a light-emitting portion that emits excitation light that excites the first SiC fluorescent portion and the second SiC fluorescent portion, wherein
the first SiC fluorescent portion and the second SiC fluorescent portion are formed of a SiC crystal in which carbon atoms are disposed in a cubic site and a hexagonal site and are configured such that a ratio of a donor impurity substituting a carbon atom at a cubic site to a donor impurity substituting a carbon atom at a hexagonal site is larger than a ratio of the cubic site to the hexagonal site in a crystal structure.

2. A light-emitting device comprising: a first SiC fluorescent portion in which a donor impurity and an acceptor impurity are added and which is formed of a SiC crystal; a second SiC fluorescent portion which is formed of a SiC crystal in which the same donor impurity as the first SiC fluorescent portion and the same acceptor impurity as the first SiC fluorescent portion are added, and in which a concentration of the acceptor impurity is higher than the concentration of the acceptor impurity in the first SiC fluorescent portion and an emission wavelength is longer than that of the first SiC fluorescent portion; and a light-emitting portion that emits excitation light that excites the first SiC fluorescent portion and the second SiC fluorescent portion, wherein the donor impurity is nitrogen, the acceptor impurity is boron, the concentration of the acceptor impurity in the first SiC fluorescent portion is lower than $5 \times 10^{18}/cm^3$, and the concentration of the acceptor impurity in the second SiC fluorescent portion is higher than $5 \times 10^{18}/cm^3$, wherein the first SiC fluorescent portion and the second SiC fluorescent portion are formed so that the concentration of the acceptor impurity therein is substantially uniform, wherein the light-emitting device comprises a LED element including a SiC substrate which includes a first SiC layer that forms the first SiC fluorescent portion and a second SiC layer that forms the second SiC fluorescent portion and a GaN-based semiconductor layer that is formed on the SiC substrate to form the light-emitting portion, wherein the LED element is included as a SiC fluorescent LED element, the SiC substrate of the SiC fluorescent LED element forms a 6H-type SiC red fluorescent portion that emits red light when excited by ultraviolet light, and the GaN-based semiconductor layer of the SiC fluorescent LED element emits ultraviolet light, wherein at least one of LED elements other than the SiC fluorescent LED element includes a nitride semiconductor layer that emits ultraviolet light and a SiC substrate including a 4H-type SiC green fluorescent portion which is doped with nitrogen as a donor impurity and a boron as an acceptor impurity and which emits green light when excited by the ultraviolet light.

* * * * *